United States Patent
Kim et al.

(10) Patent No.: US 12,426,472 B2
(45) Date of Patent: Sep. 23, 2025

(54) DISPLAY DEVICE AND METHOD FOR MANUFACTURING THE SAME

(71) Applicant: SAMSUNG DISPLAY CO., LTD., Yongin-si (KR)

(72) Inventors: Soodong Kim, Hwaseong-si (KR); Youngsoo Kwon, Hwaseong-si (KR); Hye-Jin Paek, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 464 days.

(21) Appl. No.: 17/926,516

(22) PCT Filed: Oct. 12, 2020

(86) PCT No.: PCT/KR2020/013833
§ 371 (c)(1),
(2) Date: Nov. 18, 2022

(87) PCT Pub. No.: WO2021/251560
PCT Pub. Date: Dec. 16, 2021

(65) Prior Publication Data
US 2023/0263029 A1    Aug. 17, 2023

(30) Foreign Application Priority Data
Jun. 9, 2020    (KR) .................. 10-2020-0069442

(51) Int. Cl.
*H10K 59/50*    (2023.01)
*H10K 59/12*    (2023.01)
(Continued)

(52) U.S. Cl.
CPC ......... *H10K 59/38* (2023.02); *H10K 59/1201* (2023.02); *H10K 59/877* (2023.02)

(58) Field of Classification Search
CPC .. H10K 59/38; H10K 59/1201; H10K 59/877; H10K 50/115; H10K 2102/331; H10K 59/50; G02B 5/20; G02B 5/206
See application file for complete search history.

(56) References Cited

U.S. PATENT DOCUMENTS 11,139,348 B2    10/2021    Kim et al.
11,215,859 B2    1/2022    Lee et al.
(Continued)

FOREIGN PATENT DOCUMENTS

CN    110794489 A    2/2020
JP    2011071041 A    4/2011
(Continued)

OTHER PUBLICATIONS

International Search Report—PCT/KR2020/013833 dated Mar. 8, 2021.

*Primary Examiner* — Donald L Raleigh
(74) *Attorney, Agent, or Firm* — CANTOR COLBURN LLP

(57) ABSTRACT

A display device includes: a display panel; and a light control member disposed on the display panel. The light control member includes: a plurality of barrier ribs spaced apart from each other; and a plurality of light control units disposed between the plurality of barrier ribs, respectively, and at least one of the plurality of light control units includes: a first layer including a first base resin, and a coupling agent dispersed in the first base resin; and a second layer disposed on the first layer, and including a second base resin and light emitting bodies dispersed in the second base resin.

20 Claims, 20 Drawing Sheets

(51) Int. Cl.
*H10K 59/38* (2023.01)
*H10K 59/80* (2023.01)

(56) References Cited

U.S. PATENT DOCUMENTS

| | | | |
|---|---|---|---|
| 11,650,363 | B2 | 5/2023 | Lee et al. |
| 2017/0328541 | A1 | 11/2017 | Yoneyama et al. |
| 2019/0243200 | A1* | 8/2019 | Park .................... G02F 1/1339 |
| 2020/0032137 | A1 | 1/2020 | Watano et al. |
| 2020/0152705 | A1 | 5/2020 | Son et al. |
| 2020/0312916 | A1 | 10/2020 | Kim et al. |
| 2021/0273142 | A1 | 9/2021 | Kang et al. |

FOREIGN PATENT DOCUMENTS

| | | |
|---|---|---|
| JP | 2018132662 A | 8/2018 |
| KR | 1020140117722 A | 10/2014 |
| KR | 1020170094166 A | 8/2017 |
| KR | 20190004827 A | 1/2019 |
| KR | 1020190057190 A | 5/2019 |
| KR | 1020200001649 A | 1/2020 |
| KR | 1020200055846 A | 5/2020 |
| KR | 1020200063964 A | 6/2020 |

\* cited by examiner

DISPLAY DEVICE AND METHOD FOR MANUFACTURING THE SAME

This application claims priority to Korean Patent Application No. 10-2020-0069442, filed on Jun. 9, 2020, and all the benefits accruing therefrom under 35 U.S.C. § 119, the content of which in its entirety is herein incorporated by reference.

TECHNICAL FIELD

The present invention herein relates to a display device and a method for manufacturing the same, and more particularly, to a display device having increased light emitting efficiency and reliability, and a method for manufacturing the same.

BACKGROUND ART

A display panel includes a transmissive display panel that selectively transmits source light generated from a light source, and an emissive display panel that generates source light from a display panel itself. The display panel may include different types of color control layers according to pixels to generate color images. The color control layers may transmit only source light having a predetermined wavelength range or may convert the color of the source light. Some color control layers may also change the characteristics of light without converting the color of the source light.

DISCLOSURE OF THE INVENTION

Technical Problem

A task to be solved by the present invention is to provide a display device having improved display quality and reliability.

Another task to be solved by the present invention is to provide a method for manufacturing a display device having improved display quality with reduced process and costs.

Technical Solution

A display device according to an embodiment of the present invention includes: a display panel; and a light control member disposed on the display panel. The light control member includes: a plurality of barrier ribs spaced apart from each other; and a plurality of light control units disposed between the plurality of barrier ribs, respectively, and at least one of the plurality of light control units includes: a first layer including a first base resin, and a coupling agent dispersed in the first base resin; and a second layer disposed on the first layer, and including a second base resin and light emitting bodies dispersed in the second base resin.

The second layer may further include scattering particles dispersed in the second base resin.

The first layer may further include scattering particles dispersed in the first base resin.

The first layer may have a first inorganic material concentration, and the second layer may have a second inorganic material concentration different from the first inorganic material concentration.

A difference between the first inorganic material concentration and the second inorganic material concentration may be about 1 percentage by weight (wt %) to about 20 wt %.

The second layer may not contain the coupling agent.

A difference between acid value and amine value in each of the first base resin and the second base resin may be less than about 5 milligrams of potassium hydroxide per gram (mg KOH/g).

A difference between acid value and amine value in each of the first base resin and the second base resin may be about 35 mg KOH/g or more.

The display panel may include a light emitting device, which generates first light, and the plurality of light control units may include a first light control unit, which transmits the first light, a second light control unit, which converts the first light into second light, and a third light control unit, which converts the first light into third light.

The first light control unit may include a first control layer including the coupling agent, and a second control layer disposed on the first control layer; the second light control unit may include a third control layer including the coupling agent, and a fourth control layer disposed on the third control layer and including first light emitting bodies, which convert the first light into the second light; the third light control unit may include a fifth control layer including the coupling agent, and a sixth control layer disposed on the fifth control layer and including second light emitting bodies, which convert the first light into the third light, and the light emitting bodies may include the first light emitting bodies and the second light emitting bodies.

Each of the first control layer, the third control layer, and the fifth control layer may further include the first light emitting bodies.

The third control layer may further include the first light emitting bodies, and the fifth control layer further comprise the second light emitting bodies.

A display device according to an embodiment of the present invention includes: a display panel, which generates first light; and a light control member disposed on the display panel. The light control member includes: a first light control unit, which transmits the first light, a second light control unit, which converts the first light into second light, and a third light control unit, which converts the first light into third light, and at least one of the first light control unit, the second light control unit, or the third light control unit includes: a first layer including a first base resin, a coupling agent dispersed in the first base resin, and scattering particles dispersed in the first base resin; and a second layer disposed on the first layer, and including a second base resin and light emitting bodies dispersed in the second base resin.

A method for manufacturing a display device according to an embodiment of the present invention includes preparing a display panel; and forming a light control member on the display panel, wherein the forming of the light control member includes: providing a first ink including a coupling agent to form a first ink layer; providing a second ink including light emitting bodies on the first ink layer to form a second ink layer; and curing the first ink layer and the second ink layer.

The first ink may include a first resin, scattering particles dispersed in the first resin, and the coupling agent dispersed in the first resin; the second ink may include a second resin, scattering particles dispersed in the second resin, and the light emitting bodies dispersed in the second resin; and the first ink may have a first inorganic material concentration, and the second ink may have a second inorganic material concentration different from the first inorganic material concentration.

A difference between the first inorganic material concentration and the second inorganic material concentration may be about 1 wt % to about 10 wt %.

A difference between acid value and amine value in each of the first resin and the second resin may be less than about 5 mg KOH/g or about 35 mg KOH/g or more.

The forming of the light control member may further include forming a plurality of barrier ribs before the providing of the first ink, and the first ink and the second ink may be provided in at least one of the regions defined between the plurality of barrier ribs.

The providing of the first ink may include providing the regions between plurality of barrier ribs with a first pattern ink including scattering particles, a second pattern ink including first light emitting bodies, and a third pattern ink including second light emitting bodies different from the first light emitting bodies, respectively.

The providing of the first ink may include providing the regions between the plurality of barrier ribs with the common first ink, and the providing of the second ink may include providing, on the first ink layer, a first sub-ink including the first light emitting bodies, and a second sub-ink including the second light emitting bodies different from the first light emitting bodies.

Advantageous Effects

According to an embodiment of the present invention, a coupling agent included in a lower layer of a light control unit allows an increase in coupling force between the light control unit and a base layer to improve reliability, and to prevent light emitting efficiency of light emitting bodies included in an upper layer of the light control unit from being reduced, and thus a display device may exhibit excellent display quality.

According to an embodiment of the present invention, provided is a method for manufacturing a display device in which storage characteristics of ink forming a light control unit are prevented from being deteriorated to reduce costs, and the light control unit having a plurality of layers may be formed through a single curing process, thereby reducing the process costs and time.

MODE FOR CARRYING OUT THE INVENTION

Figure 1:
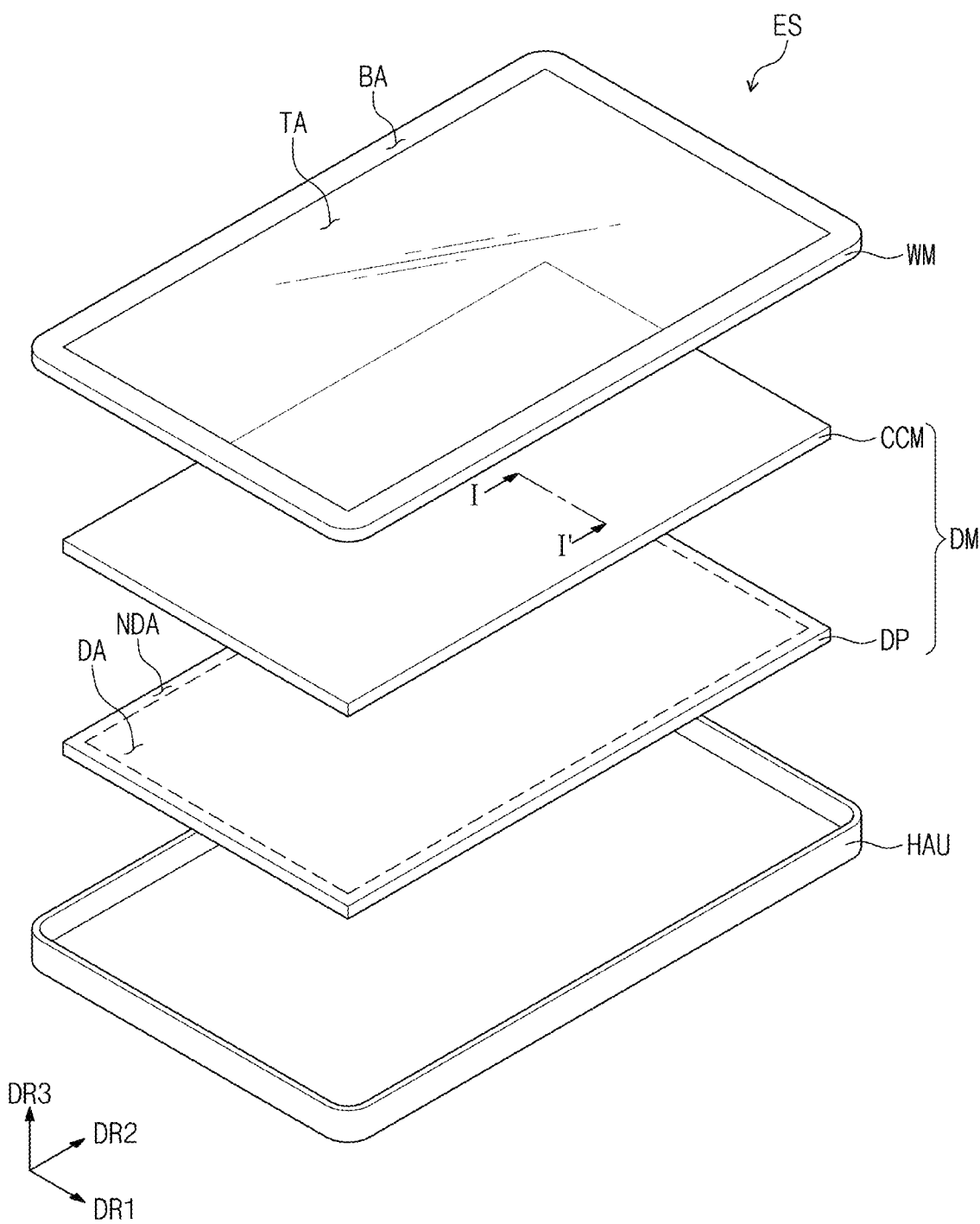
FIG. 1 is an exploded perspective view of a display device according to an embodiment of the present invention.

Hereinafter, embodiments of the present invention will be described with reference to the accompanying drawings.

In the present description, when an element (or a region, a layer, a portion, etc.) is referred to as being "on," "connected to," or "coupled to" another element, it means that the element may be directly connected to/coupled to the other element, or that a third element may be disposed therebetween.

Like numbers refer to like elements throughout. In addition, in the drawings, the thickness, the ratio, and the dimensions of elements are exaggerated for an effective description of technical contents. The term "and/or," includes all combinations of one or more of which associated configurations may define.

It will be understood that, although the terms first, second, etc. may be used herein to describe various elements, these elements should not be limited by these terms. These terms are only used to distinguish one element from another element. For example, a first element may be referred to as a second element, and similarly, a second element may be referred to as a first element without departing from the teachings of the present disclosure. The singular forms are intended to include the plural forms as well, unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

As used herein, being "disposed directly on" may mean that there is no additional layer, film, region, plate, or the like between a part and another part such as a layer, a film, a region, a plate, or the like. For example, being "disposed directly on" may mean that two layers or two members are disposed without using an additional member such as an adhesive member, therebetween.

Unless otherwise defined, all terms (including technical and scientific terms) used herein have the same meaning as commonly understood by one of ordinary skill in the art to which the present invention pertains. It is also to be understood that terms defined in commonly used dictionaries should be interpreted as having meanings consistent with the meanings in the context of the related art, and are not limited unless they are interpreted in an ideal or overly formal sense.

Hereinafter, a light control member according to an embodiment of the present invention and a display device including the same will be described with reference to the accompanying drawings.

Figure 2:
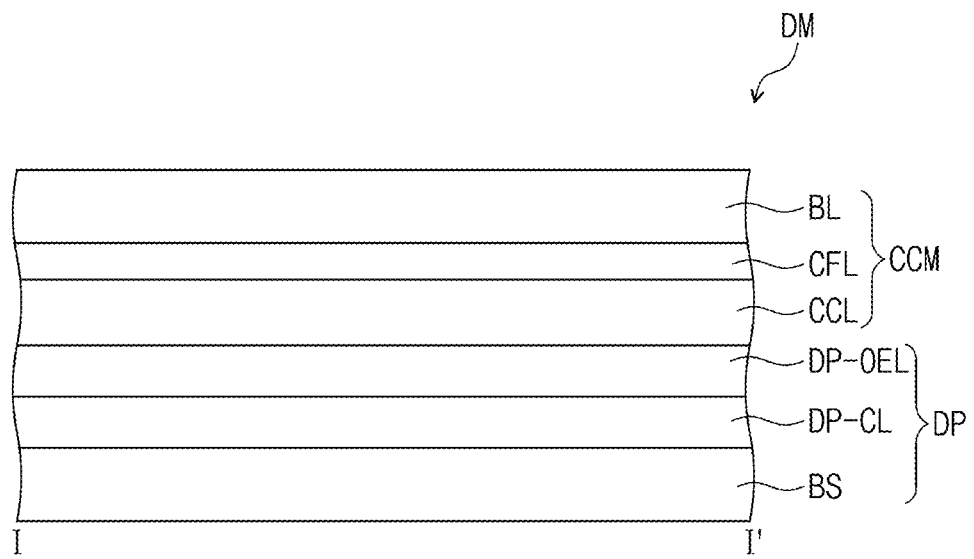
FIG. 2 is a cross-sectional view of a display module according to an embodiment of the present invention.

FIG. 1 is an exploded perspective view of a display device according to an embodiment of the present invention. FIG. 2 is a cross-sectional view of a display module according to an embodiment of the present invention. FIG. 2 is a cross-sectional view corresponding to line I-I' of FIG. 1.

In an embodiment, a display device ES may be a large-sized display device such as a television set, a monitor, or an outdoor billboard. In addition, the display device ES may be a display device used in a small- and medium-sized products such as a personal computer, a laptop computer, a personal digital terminal, a car navigation unit, a game console, a smartphone, a tablet, and a camera. In addition, these are merely presented as an example, and thus it may be adopted for other display devices without departing from the present invention.

The display device ES of an embodiment may include a window WM, a display module DM, and a housing HAU. The display module DM may include a display panel DP, which is a display element. Although not shown in the drawing, the display device ES may include various types of elements activated according to electrical signals, such as a display element, a touch element, or a detection element.

FIG. 1 and the following drawings illustrate the first to third directions DR1 to DR3, and directions indicated by the first to third directions DR1, DR2, and DR3 described herein are relative concepts, and may thus be changed to other directions.

In the present description, for the convenience of description, the third direction DR3 is defined as a direction in which images are provided to users. In addition, the first direction DR1 and the second direction DR2 may be perpendicular to each other, and the third direction DR3 may be a normal direction to a plane defined by the first direction DR1 and the second direction DR2. In FIG. 1, a plane defined by the first direction DR1 and the second direction DR2 may be a display surface on which images are provided.

In the display device ES according to an embodiment, the window WM may be disposed on the display module DM. The window WM may be a material including glass, sapphire, or plastic. The window WM includes a transmission area TA that transmits images provided from the display module DM, and a light blocking area BA that is adjacent to the transmission area TA and does not transmit images. Unlike what is shown in FIG. 1, in the display device ES of an embodiment, the window WM may be omitted.

In the display device ES of an embodiment, the display module DM may be disposed below the window WM. The display module DM may include a display panel DP and a light control member CCM disposed on the display panel DP.

The display panel DP may be a light emitting display panel. For example, the display panel DP may be a light emitting diode (LED) display panel, an organic electroluminescence display panel, or a quantum dot light emitting display panel. However, the embodiment of the present invention is not limited thereto.

The light emitting diode (LED) display panel may include a light emitting diode, an emission layer of the organic electroluminescence display panel may include an organic electroluminescent material, and an emission layer of the quantum dot light emitting display panel may include quantum dots or quantum rods. Hereinafter, the display panel DP included in the display device ES according to an embodiment of the present invention will be described as an organic electroluminescence display panel. However, the embodiment of the present invention is not limited thereto.

The display device ES of an embodiment may include a display panel DP and a light control member CCM disposed on an upper side of the display panel DP, and the display device ES of an embodiment may be an organic electroluminescence display device including an organic electroluminescence display panel. The display panel DP may provide first light. For example, the display panel DP may emit blue light.

The light control member CCM may convert a wavelength of light provided from the display panel DP or transmit light provided from the display panel DP. The light control member CCM may convert a wavelength of blue light provided from the display panel DP or transmit blue light.

On a plane, one surface of the display panel DP on which images are displayed is defined as a display surface. The display surface includes a display area DA in which images are displayed and a non-display area NDA in which images are not displayed. The display area DA is defined in the center of the display panel DP on a plane, and may overlap the transmission area TA of the window WM.

The housing HAU may be disposed under the display panel DP and accommodate the display panel DP. The housing HAU may be disposed to cover the display panel DP such that an upper surface, which is the display surface of the display panel DP is exposed. The housing HAU may cover a side surface and a bottom surface of the display panel DP, and expose the whole upper surface.

Referring to FIG. 2, the display panel DP may include a base substrate BS, a circuit layer DP-CL provided on the base substrate BS, and a display element layer DP-OEL. In an embodiment, the base substrate BS, the circuit layer DP-CL, and the display element layer DP-OEL may be sequentially stacked in the third direction DR3.

The base substrate BS may be a member providing a base surface in which the display element layer DP-OEL is disposed. The base substrate BS may be a glass substrate, a metal substrate, a plastic substrate, etc. However, the embodiment of the present invention is not limited thereto, and the base substrate BS may be an inorganic layer, an organic layer, or a composite material layer.

In an embodiment, the circuit layer DP-CL may be disposed on the base substrate BS, and the circuit layer DP-CL may include a plurality of transistors (not shown). The transistors (not shown) may each include a control electrode, an input electrode, and an output electrode. For example, the circuit layer DP-CL may include a switching transistor and a driving transistor for driving an organic electroluminescence element OEL, (FIGS. 12A and 12B) of the display element layer DP-OEL.

The light control member CCM is disposed on the display panel DP. The light control member CCM may include a light control layer CCL, a color filter layer CFL, and a base layer BL. For example, the display panel DP may include an organic electroluminescence element OEL (FIGS. 12A and 12B) emitting first light, and the light control member CCM may include the light control unit CCP (FIG. 3) for converting wavelength of first light provided from the organic electroluminescence element OEL (FIGS. 12A and 12B) or transmitting first light.

Figure 3:
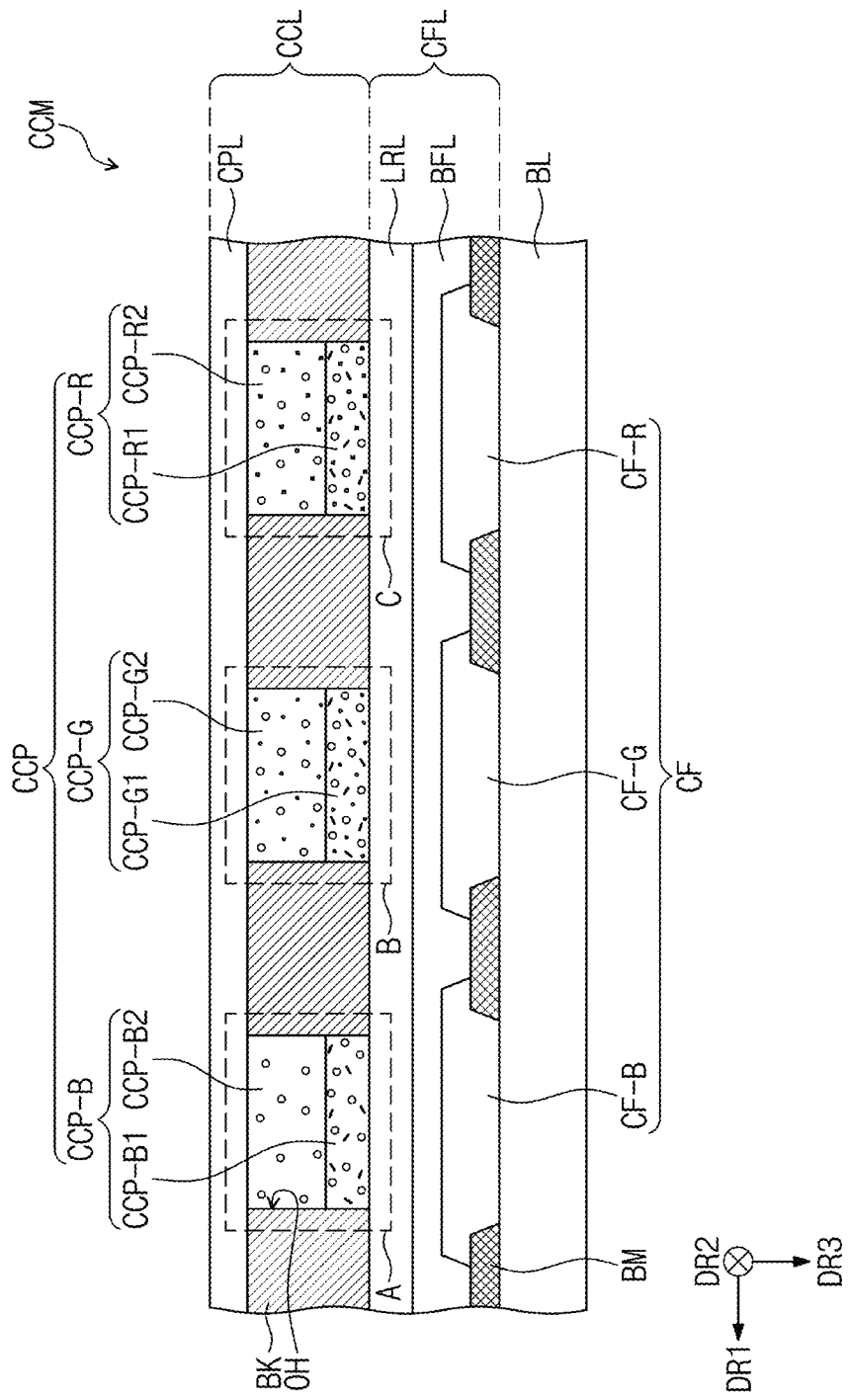
FIG. 3 is a cross-sectional view of a light control member according to an embodiment of the present invention.

FIG. 3 is a cross-sectional view showing a light control member according to an embodiment of the present invention. FIG. 3 shows components of a light control member CCM, sequentially stacked along a direction opposite to the third direction DR3.

Figure 12A:
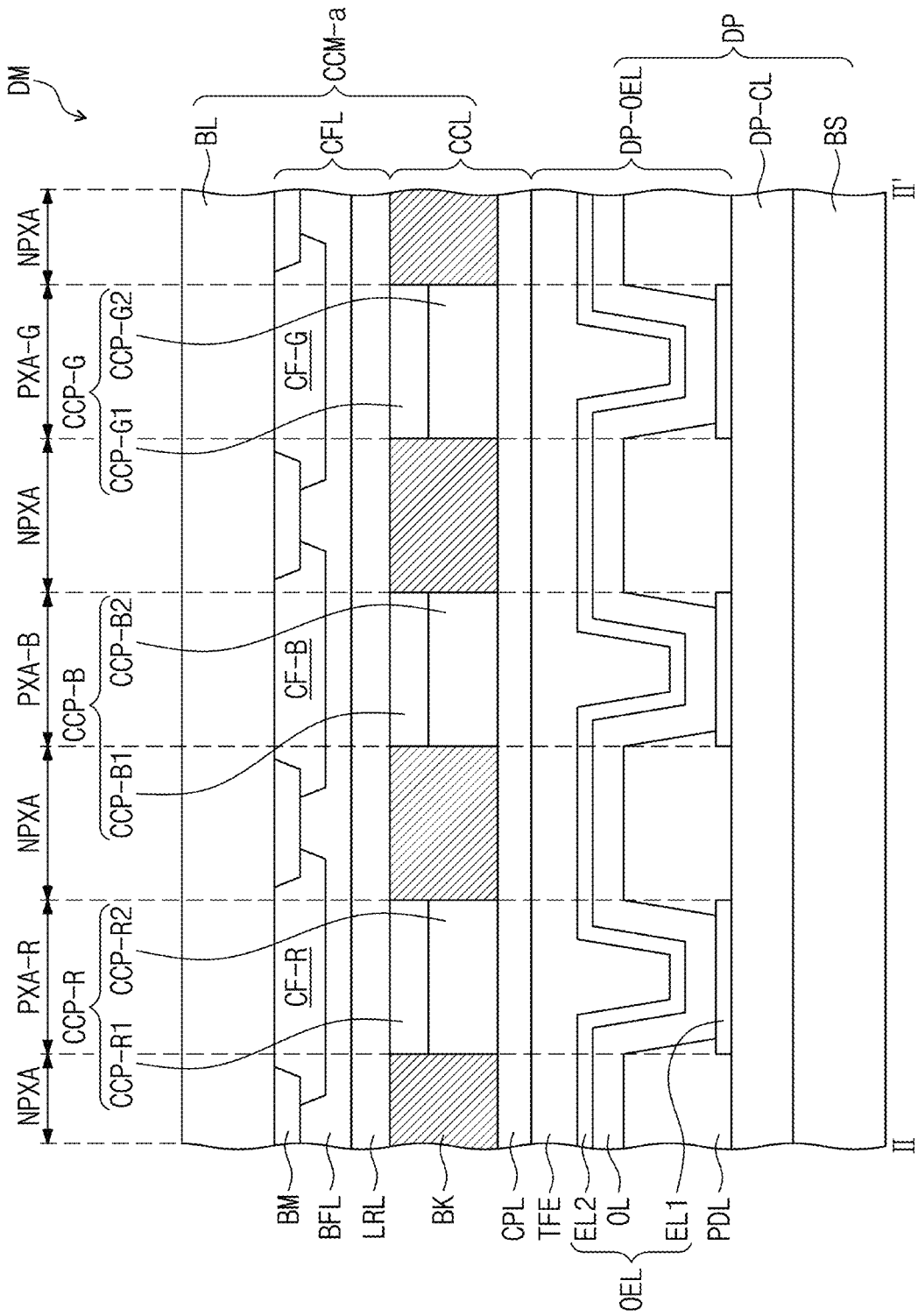
FIGS. 12A and 12B are cross-sectional views enlarging and showing a portion of a display module included in a display device according to an embodiment of the present invention.
Figure 12B:
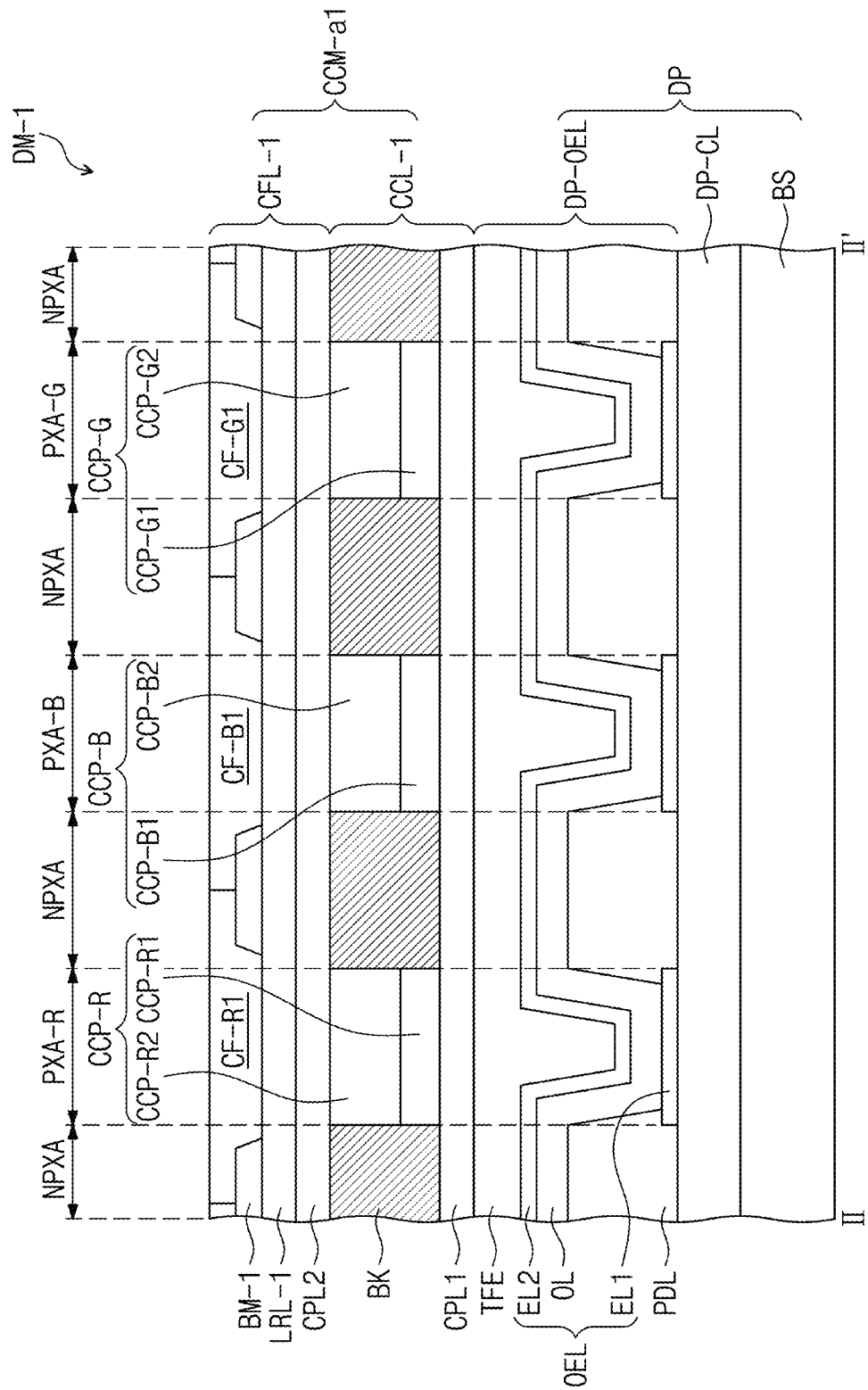

Referring to FIG. 3, the light control member CCM includes a base layer BL, and a light control layer CCL disposed below the base layer BL with respect to the third direction DR3. The light control layer CCL may include a plurality of barrier ribs BK disposed spaced apart from each other and a plurality of light control units CCP disposed between the barrier ribs BK. That is, the light control member CCM according to an embodiment may include a base layer BL, a plurality of barrier ribs BK disposed on the base layer BL, and light control units CCP disposed between the plurality of barrier ribs BK spaced apart from each other. Although FIG. 3 shows, as an example, that the base layer BL providing a reference surface on which the light control layer CCL is disposed is separately provided, the embodiment of the present invention is not limited thereto, and the light control layer CCL may be disposed on the reference surface provided by the thin film encapsulation layer TFE (FIG. 12B) of the display element layer DP-OEL (FIG. 12B).

The light control member CCM of an embodiment may include a plurality of light control units CCP-R, CCP-B, and CCP-G. The light control units CCP may include a first light control unit CCP-B for transmitting first light, a second light control unit CCP-G for converting the first light into second light, and a third light control unit CCP-R for converting the first light into third light. The second light may be light of a longer wavelength range than the first light, and the third light may be light of a longer wavelength range than each of the first light and the second light. For example, the first light may be blue light, the second light may be green light, and the third light may be red light. The first light may be light having a wavelength range of 410 nanometers (nm) to 480 nm, the second light may be light having a wavelength range of 500 nm to 570 nm, and the third light may be light having a wavelength range of 625 nm to 675 nm. The first light may be source light provided from the display panel DP (FIG. 2) to the light control unit CCP.

The first light control unit CCP-B may be a transmission unit for transmitting the wavelength of the first light without converting the first light. The second light control unit CCP-G and the third light control unit CCP-R may include light emitting bodies. The light emitting bodies may be particles for converting the wavelength of the incident light to emit light of a different wavelength. In an embodiment, the light emitting bodies included in the second light control unit CCP-G and the third light control unit CCP-R may be quantum dots.

The quantum dots may be particles for converting the wavelength of provided light. The quantum dots may be selected from a Group II-VI compound, a Group III-V compound, a Group IV-VI compound, a Group IV element, a Group IV compound, and a combination thereof.

The Group II-VI compound may be selected from the group consisting of a binary compound selected from the group consisting of CdS, CdSe, CdTe, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof, and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In this case, the binary compound, the ternary compound, or the quaternary compound may be present in particles having a uniform concentration distribution, or may be present in the same particles having a partially different concentration distribution.

The quantum dot may have a core-shell structure including a core and a shell surrounding the core. In addition, a core/shell structure in which one quantum dot surrounds another quantum dot may be present. An interface between the core and the shell may have a concentration gradient in which the concentration of an element present in the shell becomes lower towards the center.

In an embodiment, a quantum dot may have the core/shell structure including a core having nano-crystals, and a shell surrounding the core, which are described above. The shell of the quantum dot may serve as a protection layer to prevent the chemical deformation of the core so as to keep semiconductor properties, and/or a charging layer to impart electrophoresis properties to the quantum dot. The shell may be a single layer or multiple layers. An interface between the core and the shell may have a concentration gradient in which the concentration of an element present in the shell becomes lower towards the center. Examples of the shell of the quantum dot may be a metal or non-metal oxide, a semiconductor compound, or a combination thereof.

In an embodiment, for example, the metal or non-metal oxide used in the shell may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, $NiO$, or a ternary compound such as $MgAl_2O_4$, $CoFe_2O_4$, $NiFe_2O_4$, and $CoMn_2O_4$, but the embodiment of the present invention is not limited thereto.

In addition, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiment of the present invention is not limited thereto.

A quantum dot may have a full width of half maximum ("FWHM") of a light emitting wavelength spectrum of about 45 nm or less, preferably about 40 nm or less, more preferably about 30 nm or less, and color purity or color reproducibility may be enhanced in the above ranges. In addition, light emitted through such a quantum dot is emitted in all directions, and thus a wide viewing angle may be improved.

In addition, the form of a quantum dot is not particularly limited as long as it is a form commonly used in the art, but more specifically, a quantum dot in the form of spherical, pyramidal, multi-arm, or cubic nanoparticles, nanotubes, nanowires, nanofibers, nanoplatelets, etc. may be used.

The quantum dot may control the color of emitted light according to particle size thereof, and thus the quantum dot may have various colors of emitted light such as blue, red, green, etc. The smaller the particle size of the quantum dot becomes, light in the short wavelength region may be emitted. For example, the particle size of the quantum dot emitting green light may be smaller than the particle size of the quantum dot emitting red light.

At least one of the light control units CCP-R, CCP-B, and CCP-G may have a plurality of layers. In an embodiment, the first light control unit CCP-B may include a first control layer CCP-B1 and a second control layer CCP-B2, and the second light control unit CCP-G may include a third control layer CCP-G1 and a fourth control layer CCP-G2, and the third light control unit CCP-R may include a fifth control layer CCP-R1 and a sixth control layer CCP-R2. A two-layer structure included in each of the light control units CCP-R, CCP-B, and CCP-G will be described later with reference to FIGS. 4A to 4C.

The barrier ribs BK may define an opening OH exposing one surface of the color filter layer CFL disposed to overlap the light control layer CCL. The light control units CCP-R, CCP-B, and CCP-G may fill the opening OH.

The light control member CCM according to an embodiment may further include a color filter layer CFL. The color filter layer CFL may be disposed between the base layer BL and the light control layer CCL. The color filter layer CFL may include a light blocking unit BM and a filter CF.

The light blocking unit BM may be disposed on the base layer BL. A plurality of light blocking units BM may be disposed to be spaced apart from each other while exposing a portion of the base layer BL. Filters CF-B, CF-G, and CF-R may be disposed between the light blocking units BM.

The filter CF may include a plurality of filters CF-B, CF-G, and CF-R. That is, the color filter layer CFL may include a first filter CF-B for transmitting a first color light, a second filter CF-G for transmitting a second color light, and a third filter CF-R for transmitting a third color light. For example, the first filter CF-B may be a blue filter, the second filter CF-G may be a green filter, and the third filter CF-R may be a red filter.

Each of the filters CF-B, CF-G, and CF-R may include a polymer photosensitive resin and a pigment or a dye. The first filter CF-B may include a blue pigment or a blue dye, the second filter CF-G may include a green pigment or a green dye, and the third filter CF-R may include a red pigment or a red dye.

The embodiment of the present invention is not limited thereto, and the first filter CF-B may not include a pigment or a dye. The first filter CF-B may include a polymer photosensitive resin, but not include a pigment or a dye. The first filter CF-B may be transparent. The first filter CF-B may be formed of a transparent photosensitive resin.

The light blocking unit BM may be a black matrix. The light blocking unit BM may be formed including an organic light blocking material or an inorganic light blocking material, both including a black pigment or a black dye. The light blocking unit BM may prevent light leakage, and separate boundaries between the adjacent filters CF-B, CF-G, and CF-R.

The plurality of light blocking units BM may be disposed to be spaced apart from each other, and each of the light blocking units BM may overlap corresponding to each of the plurality of barrier ribs BK.

The color filter layer CFL may further include a low refractive layer LRL. The low refractive layer LRL may be disposed between the filter CF and the light control layer CCL. The low refractive layer LRL may have a refractive index of about 1.1 to about 1.5. The refractive index value of the low refractive layer LRL may be controlled by the ratio of hollow inorganic particles and/or voids included in the low refractive layer LRL.

The color filter layer CFL may further include a buffer layer BFL. Although FIG. 3 shows that the buffer layer BFL is disposed between the filter CF and the low refractive layer LRL, but the embodiment is not limited thereto. For example, the buffer layer BFL may be disposed adjacent to the light control layer CCL on the low refractive layer LRL. The buffer layer BFL may be a protection layer protecting the low refractive layer LRL or the filter CF. The buffer layer BFL may be an inorganic material layer including at least one inorganic material among silicon nitride, silicon oxide, and silicon oxynitride. The buffer layer BFL may be formed of a single layer or a plurality of layers.

The base layer BL may be a member that provides a base surface on which the color filter layer CFL, the light control layer CCL, and the like are disposed. The base layer BL may be a glass substrate, a metal substrate, a plastic substrate, or the like. However, the embodiment of the present invention is not limited thereto, and the base layer BL may be an inorganic layer, an organic layer, or a composite material layer.

The light control layer CCL may further include a capping layer CPL. The capping layer CPL may be disposed on the light control unit CCP and the barrier rib BK. The capping layer CPL may serve to prevent penetration of moisture and/or oxygen (hereinafter, referred to as "moisture/oxygen"). The capping layer CPL may be disposed on the light control unit CCP to prevent the light control unit CCP from being exposed to moisture/oxygen. The capping layer CPL may include at least one inorganic layer. That is, the capping layer CPL may be formed including an inorganic material. For example, the capping layer CPL may be formed including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a metal thin film in which light transmittance is secured, etc. The capping layer CPL may further include an organic film. The capping layer CPL may be formed of a single layer or a plurality of layers.

Figure 4A:
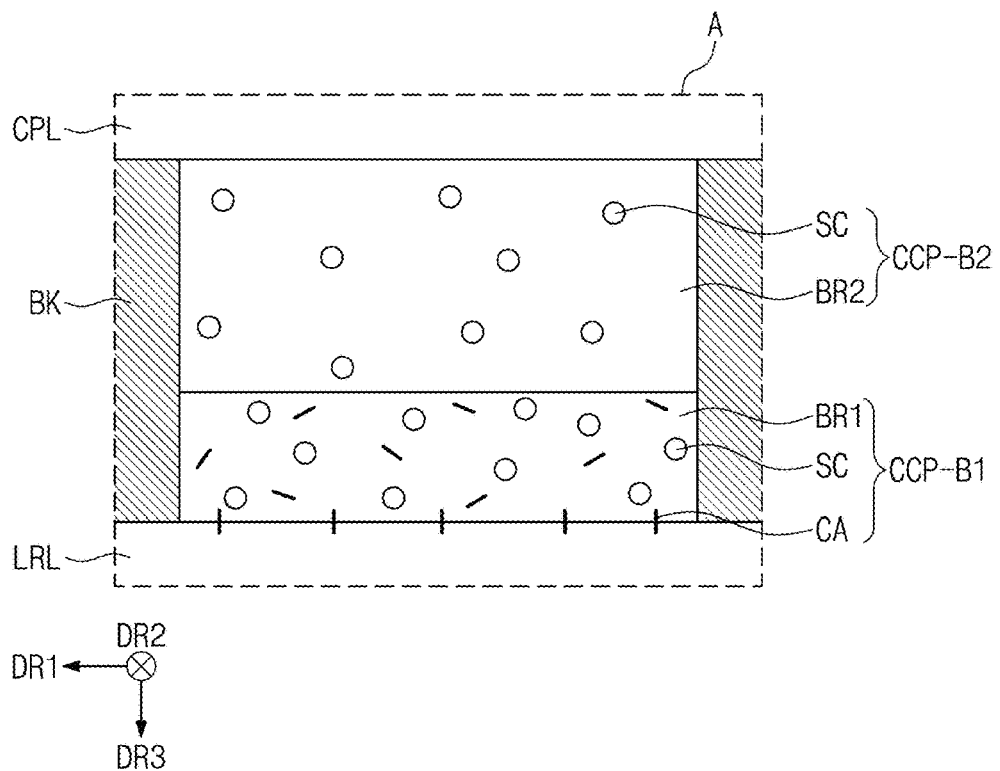
FIGS. 4A to 4C are cross-sectional views showing a portion of a light control member according to an embodiment of the present invention.
Figure 4B:
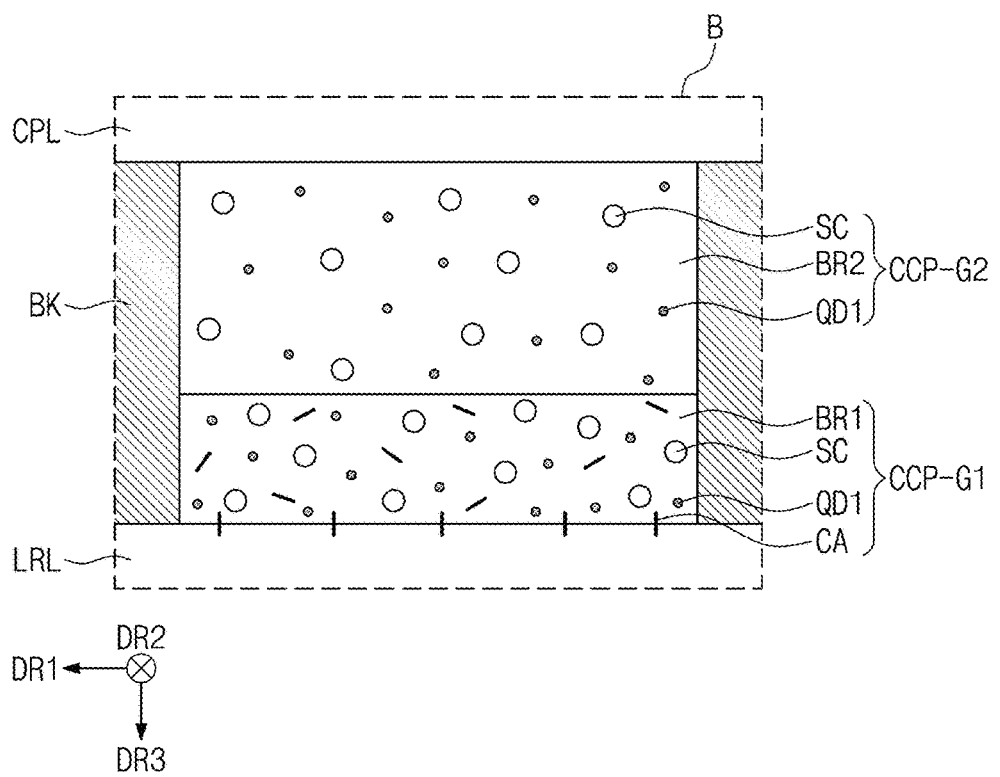
Figure 4C:
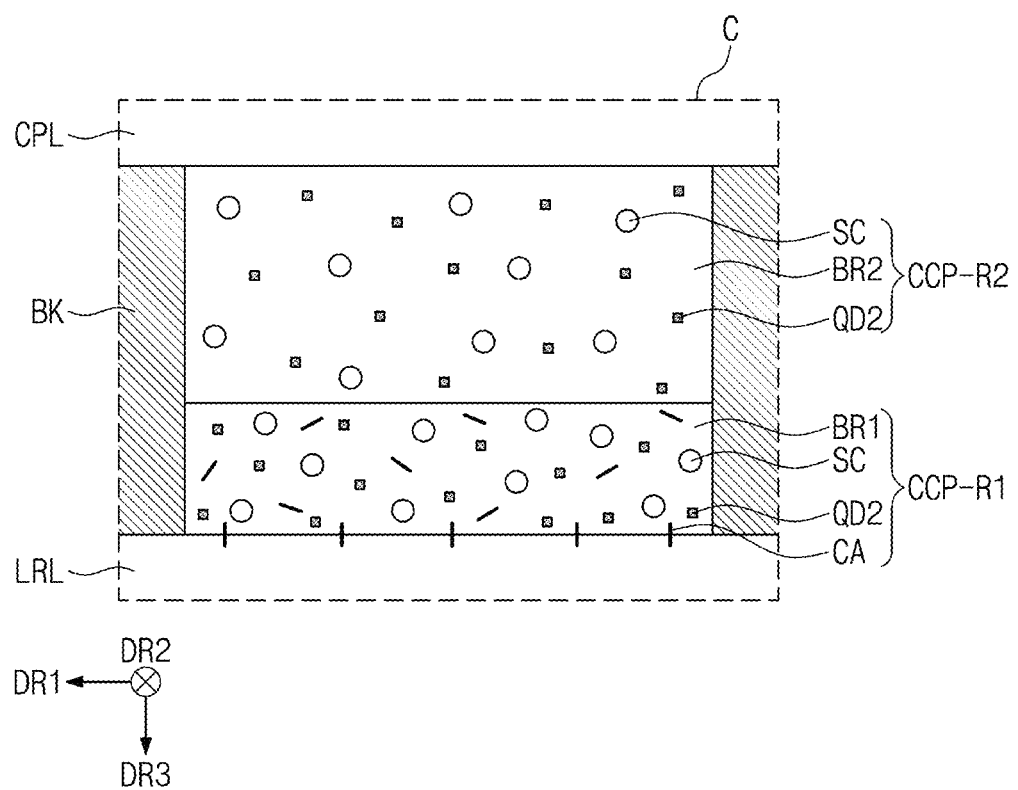
Figure 5A:
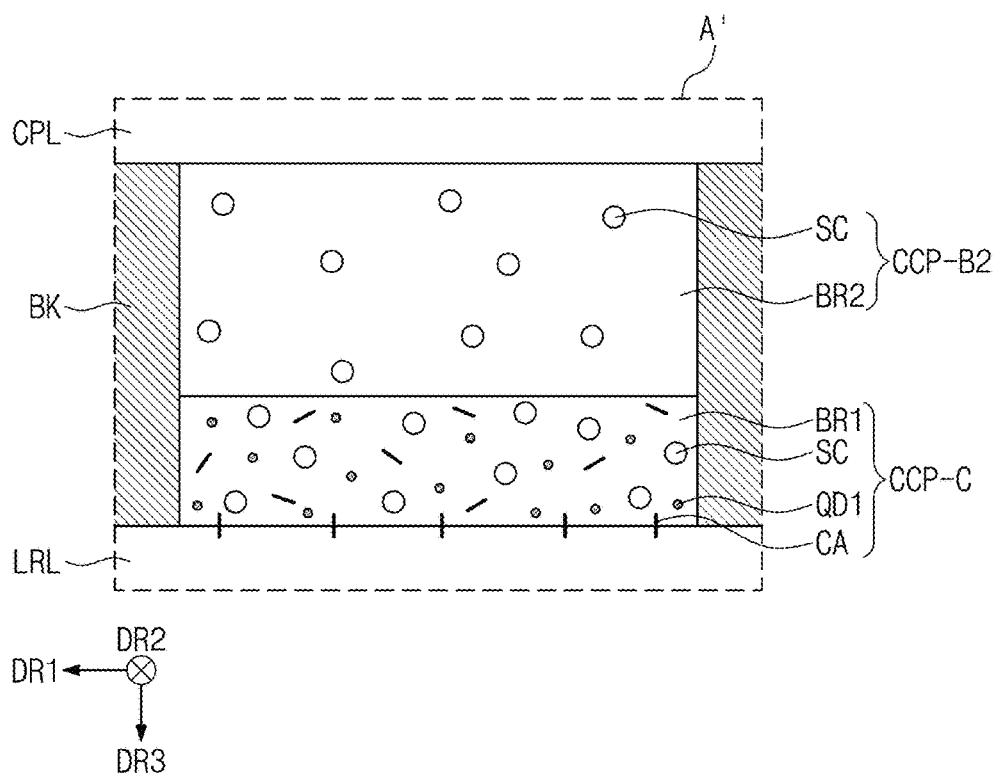
FIGS. 5A to 5C are cross-sectional views showing a portion of a light control member according to another embodiment of the present invention.
Figure 5B:
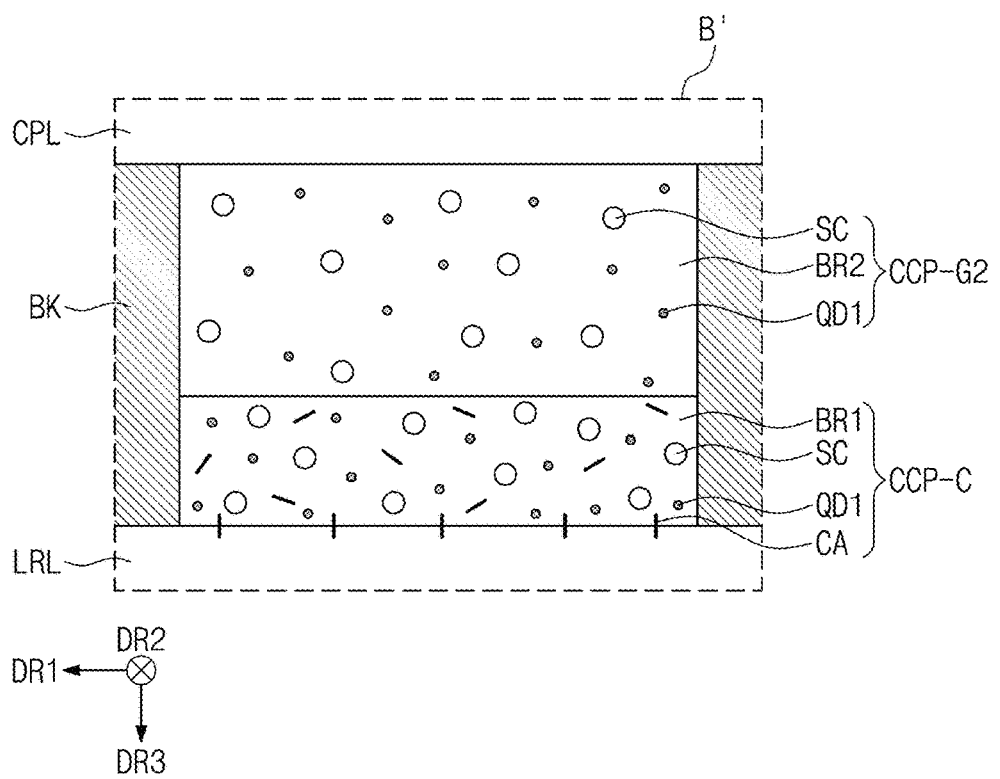
Figure 5C:
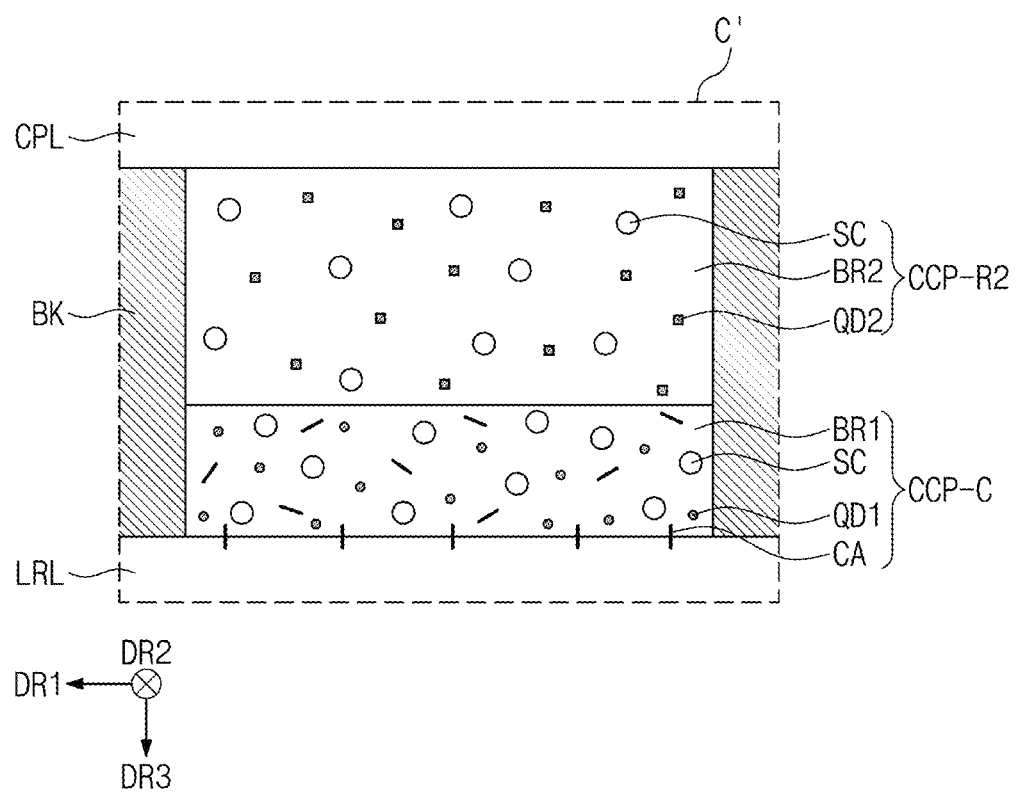

FIGS. 4A to 4C are cross-sectional views showing a portion of a light control member according to an embodiment of the present invention. FIGS. 5A to 5C are cross-sectional views showing a portion of a light control member according to another embodiment of the present invention. FIGS. 4A and 5A show views enlarging area A of FIG. 3. FIGS. 4B and 5B show views enlarging area B of FIG. 3. FIGS. 4C and 5C show views enlarging area C of FIG. 3.

Referring to FIG. 3, and FIGS. 4A to 4C, in the light control member CCM according to an embodiment, at least one of the plurality of light control units CCP may include first layers CCP-B1, CCP-G1, and CCP-R1 and second layers CCP-B2, CCP-G2, and CCP-R2. The first layers CCP-B1, CCP-G1, and CCP-R1 may be disposed adjacent to the color filter layer CFL, and the second layers CCP-B2, CCP-G2, and CCP-R2 may be a layer disposed below the first layer CCP-B1, CCP-G1, and CCP-R1 with respect to the third direction DR3 and spaced apart from the color filter layer CFL. Each of thicknesses of the second layers CCP-B2, CCP-G2, and CCP-R2 may be greater than each of the thicknesses of the first layers CCP-B1, CCP-G1, and CCP-R1.

The first layers CCP-B1, CCP-G1, and CCP-R1 include a first base resin BR1 and a coupling agent CA dispersed in the first base resin BR1. The coupling agent CA may be a material that improves the bonding force between the light control unit CCP and an adjacent component in contact with the light control unit CCP. In an embodiment, the coupling agent CA may be a material that improves the bonding force between the light control unit CCP and the low refractive layer LRL. Alternatively, when the color filter layer CFL is omitted, the coupling agent CA may be a material that improves the bonding force between the light control unit CCP and the base layer BL.

The coupling agent CA may be a silane coupling agent. The coupling agent CA, for example, may include at least one selected from the group consisting of (3-glycidoxypropyl) trimethoxysilane, (3-glycidoxypropyl)triethoxysilane, (3-glycidoxypropyl)methyldimethoxysilane, (3-glycidoxypropyl)methyldiethoxysilane, (3-glycidoxypropyl)dimethylethoxysilane, 3,4-epoxybutyltrimethoxysilane, 3,4-epoxybutyltriethoxysilane, 2-(3,4-epoxycyclohexyl) ethyltrimethoxysilane, 2-(3,4-epoxycyclohexyl) ethyltriethoxysilane, aminopropyltrimethoxysilane, aminopropyltriethoxysilane, 3-triethoxysilyl-N-(1,3-dimethyl-buty dene)propylamine, N-(2-aminoethyl)-3-aminopropyltrimethoxysilane, N-(2-aminoethyl)-3-aminopropyltriethoxysilane, N-(2-aminoethyl)-3-aminopropylmethyldimethoxysilane, N-phenyl-3-aminopropyltrimethoxysilane, and (3-isocyanatepropyl) triethoxysilane.

In the first layers CCP-B1, CCP-G1, and CCP-R1, the coupling agent CA may have a concentration of about 2 wt % or less. The coupling agent CA may be included in a weight ratio of 2:98 or less with respect to a total weight of the first layers CCP-B1, CCP-G1, and CCP-R1. A portion of the coupling agent CA included in the first layers CCP-B1, CCP-G1, and CCP-R1 may be chemically bonded to a component in contact with the first layers CCP-B1, CCP-G1, and CCP-R1.

In addition to the coupling agent CA, the first layers CCP-B1, CCP-G1, and CCP-R1 may further include an inorganic material. The inorganic material included in the first layers CCP-B1, CCP-G1, and CCP-R1 may be, for example, scattering particles SC. In an embodiment, the scattering particles SC may be $TiO_2$ or silica-based nanoparticles. The scattering particles SC may be particles that scatter light to increase light output efficiency. The scattering particles SC may be uniformly dispersed in the base resin BR.

At least a portion of the first layers CCP-B1, CCP-G1, and CCP-R1 may include light emitting bodies. In an embodiment, the light emitting bodies may not be included in the first control layer CCP-B1 among the first layers CCP-B1, CCP-G1, and CCP-R1, and first light emitting bodies QD1 may be included in the third control layer CCP-G1 and second light emitting bodies QD2 may be included in the fifth control layer CCP-R1. Each of the first light emitting bodies QD1 and the second light emitting bodies QD2 may be a quantum dot. In an embodiment, the first light emitting bodies QD1 may be a green quantum dot emitting green light, and the second light emitting bodies QD2 may be a red quantum dot emitting red light. Unlike what is shown in FIGS. 4B and 4C, light emitting bodies may not be included in the third control layer CCP-G1 and the fifth control layer CCP-R1.

The second layers CCP-B2, CCP-G2, and CCP-R2 may include a second base resin BR2 and inorganic materials dispersed in the second base resin BR2. The coupling agent CA may not be included in the second layers CCP-B2, CCP-G2, and CCP-R2. The second layers CCP-B2, CCP-G2, and CCP-R2 may be formed of the second base resin BR2 and inorganic materials dispersed in the second base resin BR2. The inorganic materials included in the second layers CCP-B2, CCP-G2, and CCP-R2 may be, for example, scattering particles SC and light emitting bodies QD1 and QD2. In an embodiment, the scattering particles SC may be included in the second control layer CCP-B2 among the second layers CCP-B2, CCP-G2, and CCP-R2, the scattering particles SC and the first light emitting bodies QD1 may be included in the fourth control layer CCP-G2, and the scattering particles SC and the second light emitting bodies QD2 may be included in the sixth control layer CCP-R2 among the second layers CCP-B2, CCP-G2, and CCP-R2.

When the concentration of inorganic materials included in the first layers CCP-B1, CCP-G1, and CCP-R1 is defined as a first inorganic material concentration, and the concentration of inorganic materials included in the second layers CCP-B2, CCP-G2, and CCP-R2 is defined as a second inorganic material concentration, the first inorganic material concentration and the second inorganic material concentration may be the same or different. The first inorganic material concentration may be the concentration of the scattering particles and the light emitting bodies included in the first layers CCP-B1, CCP-G1, and CCP-R1. The second inorganic material concentration may be the concentration of the scattering particles and the light emitting bodies included in the second layers CCP-B2, CCP-G2, and CCP-R2. In an embodiment, the first inorganic material concentration and the second inorganic material concentration are different, and a difference between the first inorganic material concentration and the second inorganic material concentration may be about 1 wt % to about 20 wt %. In another embodiment, a difference between the first inorganic material concentration and the second inorganic material concentration may be about 1 wt % to about 10 wt %. A difference between the first inorganic material concentration and the second inorganic material concentration may be about 1 wt % to about 5 wt %, in still another embodiment.

The first base resin BR1 and the second base resin BR2 are a medium in which the light emitting bodies are dispersed, and may be formed of various resin compositions that may be generally referred to as binders. However, the embodiment of the present invention is not limited thereto, and in the present description, any medium capable of dispersing light emitting bodies may be referred to as a base resin regardless of its name, additional other functions, constituent materials, and the like. The base resin may be a polymer resin. For example, the base resin may be an acrylic resin, a urethane-based resin, a silicone-based resin, an epoxy-based resin, and the like. The base resin may be a transparent resin.

The first layers CCP-B1, CCP-G1, and CCP-R1 and the second layers CCP-B2, CCP-G2, and CCP-R2 may be layers derived from a solvent-free ink. That is, the first layers CCP-B1, CCP-G1, and CCP-R1 and the second layers CCP-B2, CCP-G2, and CCP-R2 may not include a base resin, or a monomer forming a base resin through polymerization reaction, and a separate organic solvent for dissolving particles such as a coupling agent or light emitting bodies dispersed therein, and may be derived from a solvent-free ink in which particles such as a coupling agent or light emitting bodies are dispersed in a base resin.

Each of the first base resin BR1 and the second base resin BR2 may be an acidic or alkaline material. In an embodiment, both the first base resin BR1 and the second base resin BR2 may be acidic materials, or both may be alkaline materials. Alternatively, one of the first base resin BR1 and the second base resin BR2 may be an acidic material, and the other may be an alkaline material. In an embodiment, a difference between acid value and amine value in each of the first base resin BR1 and the second base resin BR2 may be about 35 mg KOH/g or more. In the present description, the acid value refers to the number of mg of KOH required to neutralize free fatty acid contained in 1 g of oil and fat, and the amine value refers to the number of mg of KOH titrated per 1 g of amine.

Alternatively, each of the first base resin BR1 and the second base resin BR2 may be a material having an amphoteric property. In an embodiment, the first base resin BR1 and the second base resin BR2 may be a material including both an acidic functional group and an alkaline functional group in a molecular structure. In an embodiment, a difference between acid value and amine value in each of the first base resin BR1 and the second base resin BR2 may be less than about 5 mg KOH/g.

In an embodiment, the first base resin BR1 and the second base resin BR2 may include a polymer compound represented by Formulas 1-1 to 1-3.

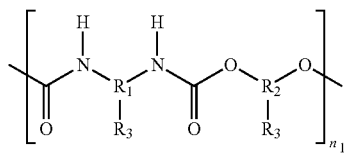

[Formula 1-1]

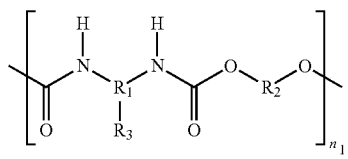

[Formula 1-2]

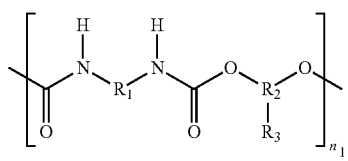

[Formula 1-3]

In Formulas 1-1 to 1-3, R1 and R2 are each independently a substituted or unsubstituted alkyl group having 1 to 10 carbon atoms, and $R_3$ is an amine group or a carboxyl group. $n_1$ is an integer of 1 to 100. When a plurality of R3's are included in the structures represented by Formulas 1-1 to 1-3, the plurality of R3's may all be an amine group or a carboxyl group.

In an embodiment, the first base resin BR1 and the second base resin BR2 may include a polymer compound represented by Formula 2-1 or Formula 2-2.

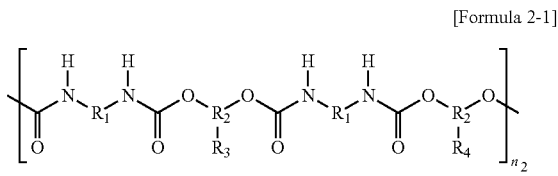

[Formula 2-1]

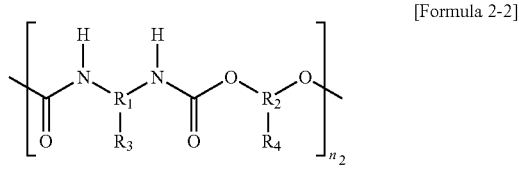

[Formula 2-2]

In Formulas 2-1 and 2-2, R1- and R2 are each independently a substituted or unsubstituted alkyl group having 1 to 10 carbon atoms. n2 is an integer of 1 to 100. R3 and R4 are different from each other, and R3 and R4 are each independently an amine group or a carboxyl group. In Formulas 2-1 and 2-2, when R3 is an amine group, R4 is a carboxyl group, and when R3 is a carboxyl group, R4 is an amine group.

In a light control member included in the display device according to an embodiment, each of a plurality of light control units included in the light control member includes a first layer and a second layer, the first layer includes a coupling agent, and the second layer does not include a coupling agent. In the light control member according to an embodiment, bonding force between the base layer and the light control unit may be secured through the first layer included in the coupling agent, and pattern characteristics of the light control unit may be improved. In addition, in the light control member according to an embodiment, the second layer including light emitting bodies does not include a coupling agent to prevent deterioration in light emitting efficiency of the light emitting bodies, and to prevent deterioration in storage characteristics of ink forming the light control unit, and accordingly, a display device including the light control member may have improved display quality and reliability.

Referring to FIG. 3, and FIGS. 5A to 5C, the first layer CCP-C may be a common layer included in the first light control unit CCP-B, the second light control unit CCP-G, and the third light control unit CCP-R. That is, the first layer CCP-C may be commonly patterned and disposed in the first light control unit CCP-B, the second light control unit CCP-G, and the third light control unit CCP-R. Each common first layer CCP-C included in the first light control unit CCP-B, the second light control unit CCP-G, and the third light control unit CCP-R may include a first base resin BR1, scattering particles SC, a coupling agent CA, and first light emitting bodies QD1. However, the embodiment is not limited thereto, and the scattering particles SC and the first light emitting bodies QD1 may be omitted in the first layer CCP-C.

Figure 6A:
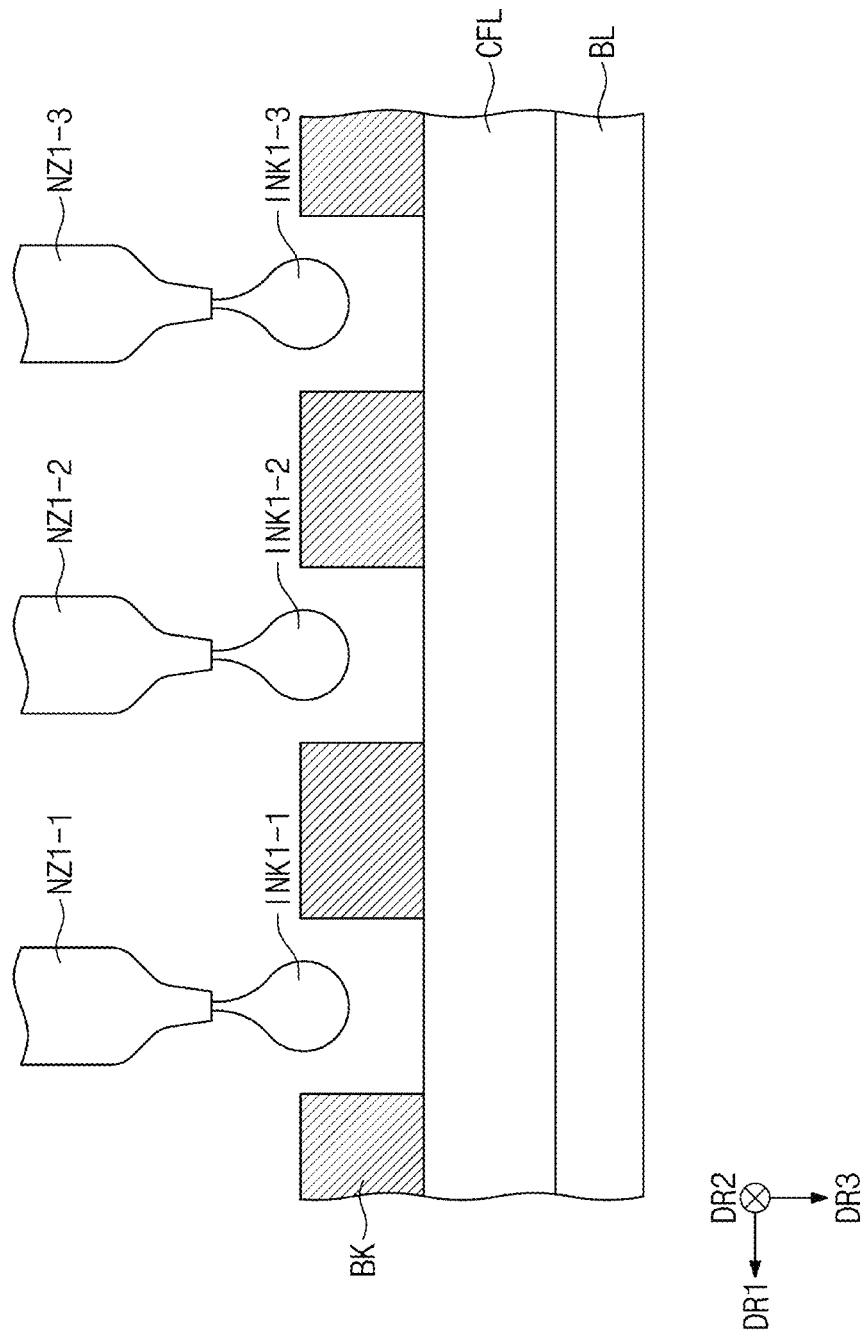
FIGS. 6A to 6C are cross-sectional views showing some processes in a method for manufacturing a display device according to an embodiment of the present invention.
Figure 6B:
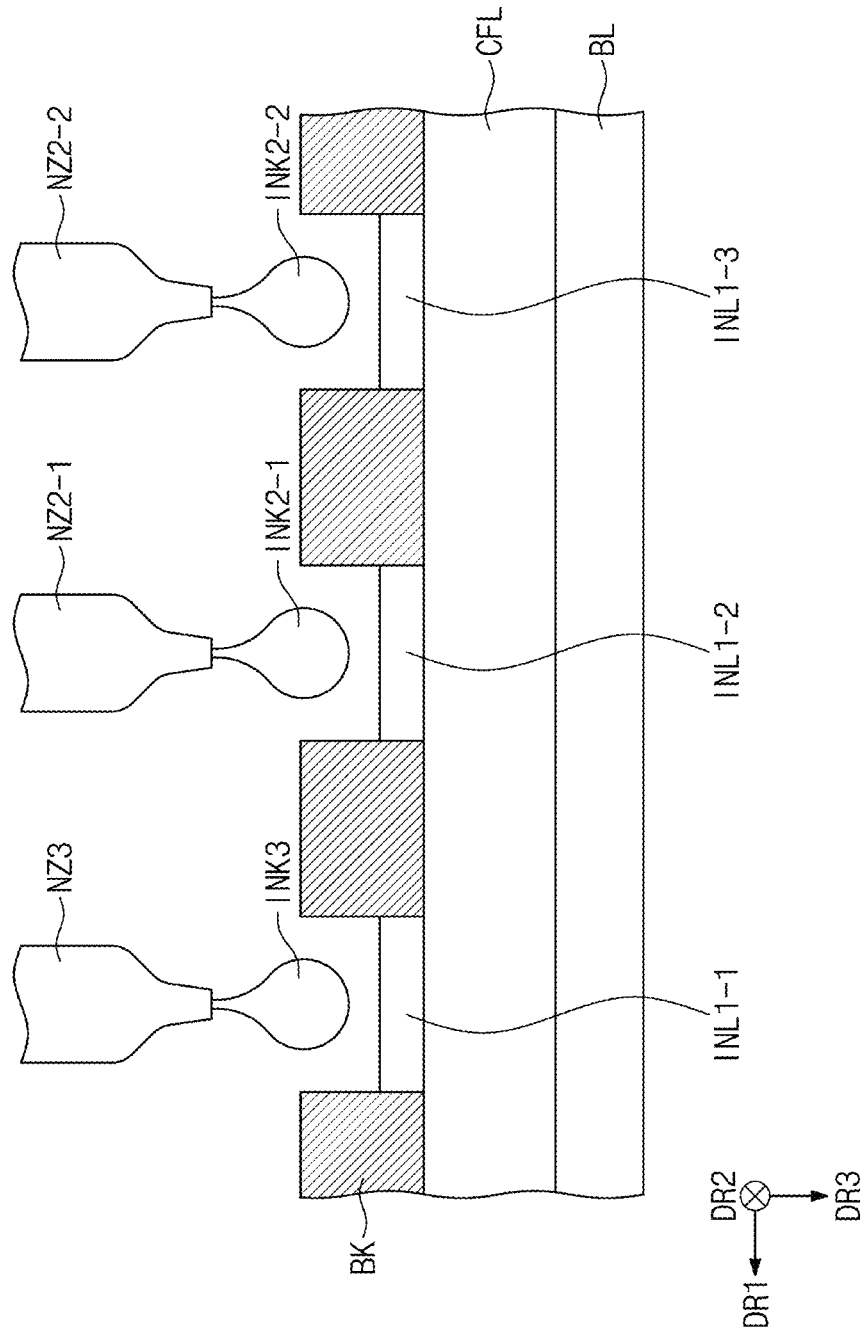
Figure 6C:
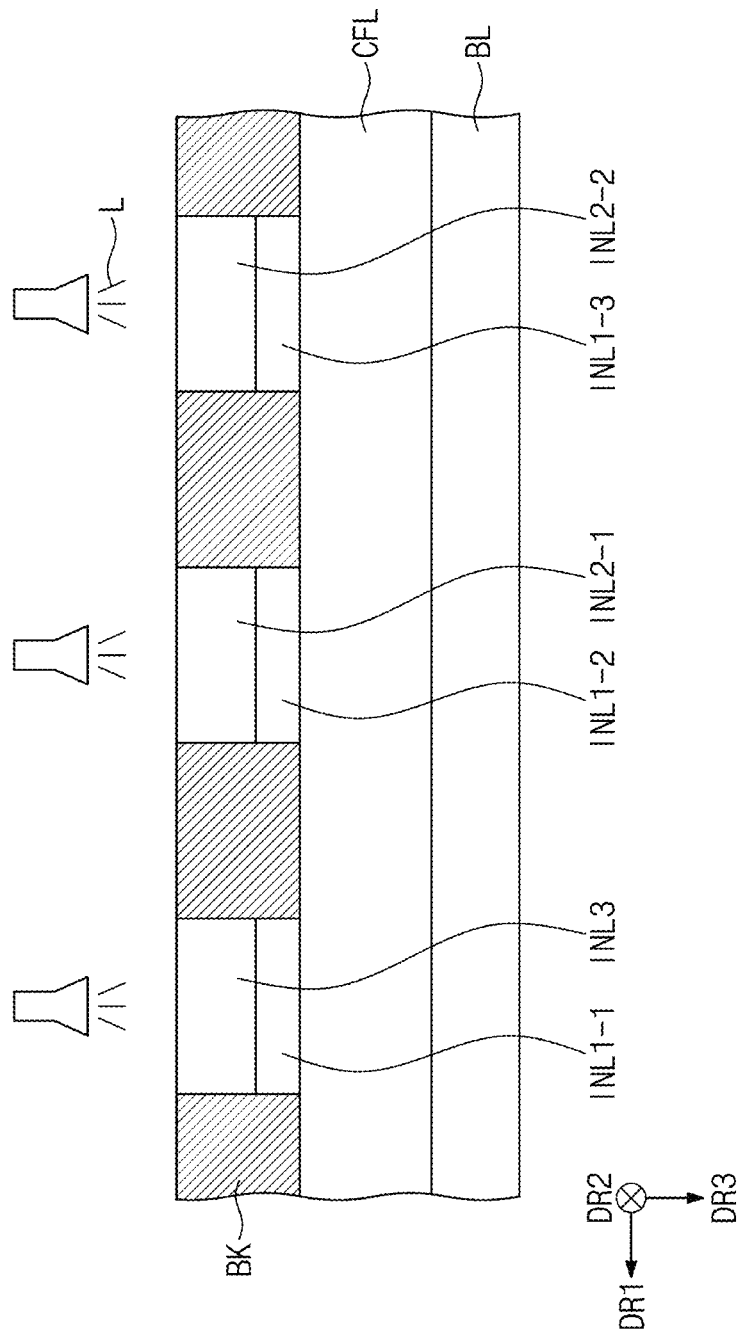

FIGS. 6A to 6C are cross-sectional views showing some processes in a method for manufacturing a display device according to an embodiment of the present invention. FIGS. 6A to 6C sequentially show processes of forming a light control member in a method for manufacturing a display device according to an embodiment of the present invention. Hereinafter, in describing a method for manufacturing a display device according to an embodiment with reference to FIGS. 6A to 6C, the same reference numerals are given for the same components as those described above, and detailed descriptions are omitted.

The method for manufacturing a display device according to an embodiment of the present invention includes preparing a display panel and forming a light control member on the display panel.

Referring to FIGS. 6A and 6B, the forming of the light control member in the method for manufacturing a display device according to an embodiment includes providing first inks INK1-1, INK1-2, and INK1-3 on a reference surface to form first ink layers INL1-1, INL1-2, and INL1-3, respectively. The first inks INK1-1, INK1-2, and INK1-3 may be applied on the reference surface through first nozzles NZ1-1, NZ1-2, and NZ1-3, respectively. FIGS. 6A and 6B show, as an example, that the base layer BL provides a reference surface on which the first inks INK1-1, INK1-2, and INK1-3 are applied, but the present invention is not limited thereto, and the first inks INK1-1, INK1-2, and INK1-3 may be applied on the reference surface provided by a thin film encapsulation layer TFE of the display element layer DP-OEL (FIG. 12B) in another embodiment. When the base layer BL provides the reference surface, before the forming of the first ink layers INL1-1, INL1-2, and INL1-3, forming a color filter layer CFL on the base layer BL and patterning a plurality of barrier ribs BK on the color filter layer CFL may be further included.

The first inks INK1-1, INK1-2, and INK1-3 each may be dripped between the plurality of barrier ribs BK. The first inks INK1-1, INK1-2, and INK1-3 may include a first pattern ink INK1-1, a second pattern ink INK1-2, and a third pattern ink INK1-3, and each of the first pattern ink INK1-1, the second pattern ink INK1-2, and the third pattern ink INK1-3 may be dripped between the plurality of barrier ribs BK through separate first nozzles NZ1-1, NZ1-2, and NZ1-3. The first pattern ink INK1-1 may form a first pattern ink layer INL1-1, the second pattern ink INK1-2 may form a second pattern ink layer INL1-2, and the third pattern ink INK1-3 may form a third pattern ink layer INL1-3. The first inks INK1-1, INK1-2, and INK1-3, and the first ink layers INL1-1, INL1-2, and INL1-3 may include a first resin and a coupling agent. The first inks INK1-1, INK1-2, and INK1-3 may be solvent-free inks. That is, the first inks INK1-1, INK1-2, and INK1-3 do not contain a separate organic solvent for dissolving the first resin and the coupling agent, and the coupling agent may be dispersed in the first resin. As the first inks INK1-1, INK1-2, and INK1-3 are solvent-free inks, the first inks INK1-1, INK1-2, and INK1-3 may have high viscosity.

Referring to FIGS. 6B and 6C, second inks INK2-1 and INK2-2 are provided on the first ink layers INL1-2, and INL1-3 to form second ink layers INL2-1 and INL2-2. The second inks INK2-1 and INK2-2 may be applied on the base layer BL through second nozzles NZ2-1 and NZ2-2. The second inks INK2-1 and INK2-2 may include a first sub-ink INK2-1 and a second sub-ink INK2-2, and each of the first sub-ink INK2-1 and the second sub-ink INK2-2 may be dripped between the plurality of barrier ribs BK through separate second nozzles NZ2-1 and NZ2-2. The first sub-ink INK2-1 may be dripped on the second pattern ink layer INL1-2 to form the first sub-ink layer INL2-1, and the second sub-ink INK2-2 may be dripped on the third pattern ink layer INL1-3 to form the second sub-ink layer INL2-2. The second inks INK2-1 and INK2-2 may include a second resin and light emitting bodies. The second inks INK2-1 and INK2-2 may be solvent-free inks. That is, the second inks INK2-1 and INK2-2 do not contain a separate organic solvent for dissolving the light emitting bodies, and the light emitting bodies may be dispersed in the second resin. As the second inks INK2-1 and INK2-2 are solvent-free inks, the second inks INK2-1 and INK2-2 may have high viscosity.

A third ink INK3 may be provided on some of the first ink layers INL1-1, INL1-2, and INL1-3 to form a third ink layer INL3. The third ink INK3 may be applied on the base layer BL through a third nozzle NZ3. The third ink INK3 may be dripped through the third nozzle NZ3 on a region where the second inks INK2-1 and INK2-2 are not dripped among the plurality of barrier ribs BK. The third ink INK3 may be dripped on a first pattern ink layer INL1-1 to form the third ink layer INL3. The third ink INK3 may not include the light emitting bodies. The third ink INK3 may include a second resin and scattering particles. The third ink INK3 may be solvent-free ink. That is, the third ink INK3 may not contain a separate organic solvent for dissolving the second resin and the scattering particles, and the scattering particles may be dispersed in the second resin in the third ink INK3. As the third ink INK3 is solvent-free ink, the third ink INK3 may have high viscosity.

When the concentration of inorganic materials included in the first ink layers INL1-1, INL1-2, and INL1-3 is defined as a first inorganic material concentration, and the concentration of inorganic materials included in the second ink layers INL2-1 and INL2-2 is defined as the second inorganic material concentration, the first inorganic material concentration and the second inorganic material concentration may be the same or different. The first inorganic material concentration may be the concentration of the scattering particles and the light emitting bodies included in the first ink layers INL1-1, INL1-2, and INL1-3. The second inorganic material concentration may be the concentration of the scattering particles and the light emitting bodies included in the second ink layers INL2-1 and INL2-2. In an embodiment, the first inorganic material concentration and the second inorganic material concentration are different, and a difference between the first inorganic material concentration and the second inorganic material concentration may be about 1 wt % to about 20 wt %. In an embodiment, a difference between the first inorganic material concentration and the second inorganic material concentration may be 1 wt % to 10 wt %. A difference between the first inorganic material concentration and the second inorganic material concentration may be 1 wt % to 5 wt %. When the concentration of the inorganic materials included in the third ink layer INL3 is defined as a third inorganic material concentration, the third inorganic material concentration may be the same as or different from the first inorganic material concentration. The third inorganic material concentration may be a concentration of scattering particles included in the third ink layer INL3.

Referring to FIG. 6C, the patterned first ink layers INL1-1, INL1-2, and INL1-3, the second ink layers INL2-1, and INL2-2, and the third ink layer INL3 may be cured together. The first ink layers INL1-1, INL1-2, and INL1-3, the second ink layers INL2-1, and INL2-2, and the third ink layer INL3 may be cured through light L. However, the embodiment is not limited thereto, and the first ink layers INL1-1, INL1-2, and INL1-3 and the second ink layers INL2-1, and INL2-2, and the third ink layer INL3 may be cured through heat, in another embodiment. The first ink layers INL1-1, INL1-2, and INL1-3, the second ink layers INL2-1, and INL2-2, and the third ink layer INL3 may be cured together to form a plurality of light control units CCP-B, CCP-G, and CCP-R (see FIG. 3).

Figure 7A:
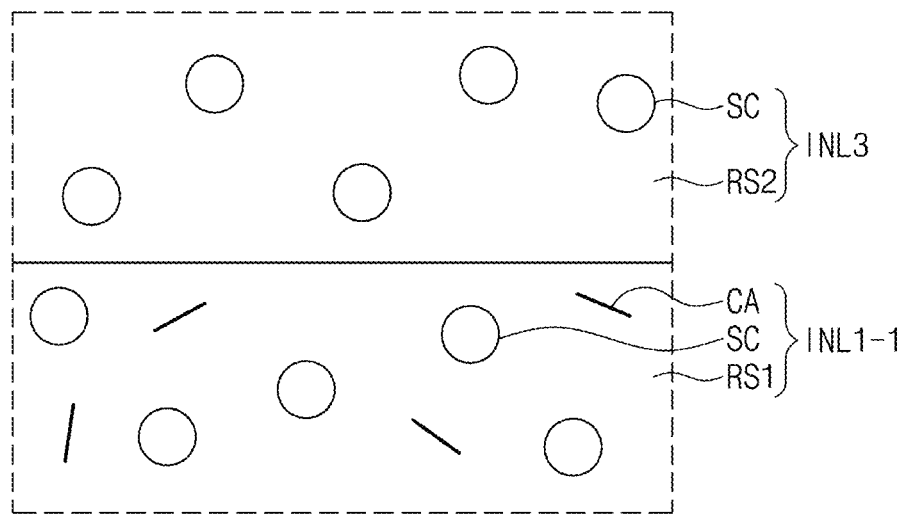
FIGS. 7A to 7C are cross-sectional views enlarging some processes in a method for manufacturing a display device according to an embodiment of the present invention.
Figure 7B:
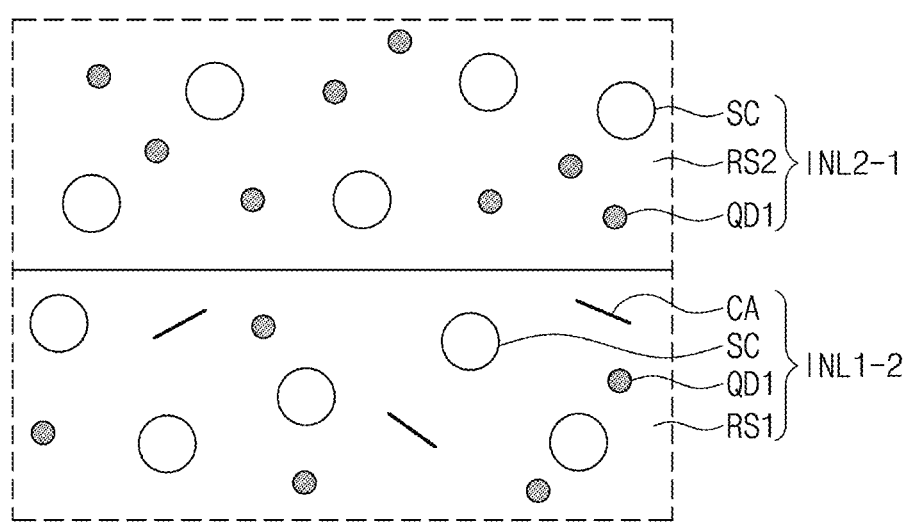
Figure 7C:
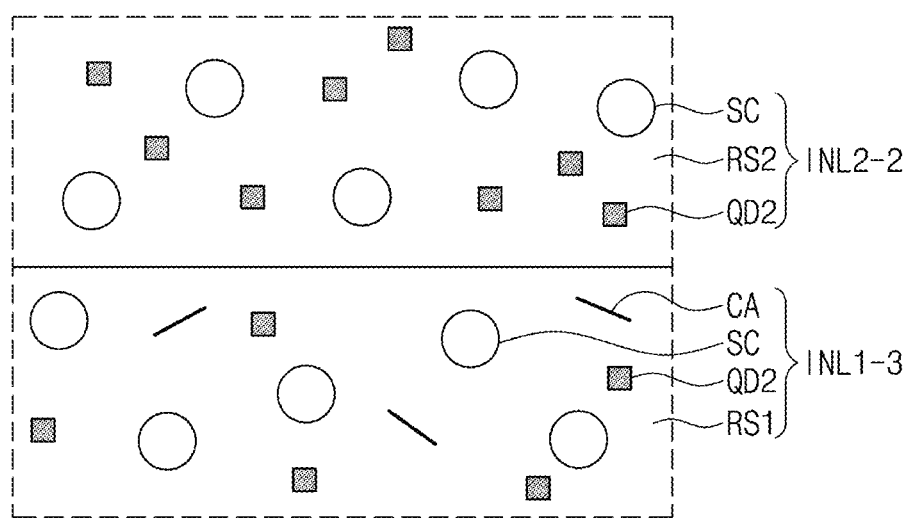

FIGS. 7A to 7C are enlarged cross-sectional views of some processes in a method for manufacturing a display device according to an embodiment. FIGS. 7A to 7C show enlarged cross-sections before curing after the forming of the second ink layer.

FIGS. 7A to 7C, the first pattern ink layer INL1-1 may include a first resin RS1, scattering particles SC, and a coupling agent CA. The third ink layer INL3 disposed on the first pattern ink layer INL1-1 may include a second resin RS2 and scattering particles SC. The second pattern ink layer INL1-2 may include a first resin RS1, scattering particles SC, first light emitting bodies QD1, and a coupling agent CA. The first sub-ink layer INL2-1 disposed on the second pattern ink layer INL1-2 may include a second resin RS2, first light emitting bodies QD1, and scattering particles SC. The third pattern ink layer INL1-3 may include a first resin RS1, scattering particles SC, second light emitting bodies QD2, and a coupling agent CA. The second sub-ink layer INL2-2 disposed on the third pattern ink layer INL1-3 may include a second resin RS2, second light emitting bodies QD2, and scattering particles SC. The descriptions in FIGS. 3 to 5C may be equally applied to the scattering particles SC, the coupling agent CA, the first light emitting bodies QD1, and the second light emitting bodies QD2. Unlike what is shown in FIGS. 7B and 7C, the first light emitting bodies QD1 may be omitted in the second pattern ink layer INL1-2, and the second light emitting bodies QD2 may be omitted in the third pattern ink layer INL1-3 in another embodiment. In addition, unlike what is shown in FIGS. 7B and 7C, in at least one of the first pattern ink layer INL1-1, the second pattern ink layer INL1-2, and the third pattern ink layer INL1-3, the scattering particles SC may be omitted in still another embodiment. In the first pattern ink layer INL1-1, the second pattern ink layer INL1-2, and the third pattern ink layer INL1-3, the light emitting bodies QD1 and QD2 and the scattering particles SC may all be omitted in yet another embodiment.

The first resin RS1 may be in a state before the first base resin BR1 (FIG. 5A) is cured. The second resin RS2 may be in a state before the second base resin BR2 (FIG. 5A) is cured.

Each of the first resin RS1 and the second resin RS2 may be an acidic or alkaline material. In an embodiment, both the first resin RS1 and the second resin RS2 may be acidic materials, or both may be alkaline materials. Alternatively, one of the first resin RS1 and the second resin RS2 may be an acidic material, and the other may be an alkaline material. In an embodiment, a difference between acid value and amine value in each of the first resin RS1 and the second resin RS2 may be about 35 mg KOH/g or more.

Alternatively, each of the first resin RS1 and the second resin RS2 may be a material having an amphoteric property. In an embodiment, the first resin RS1 and the second resin RS2 may be a material including both an acidic functional group and an alkaline functional group in a molecular structure. In an embodiment, a difference between acid value and amine value in each of the first resin RS1 and the second resin RS2 may be less than about 5 mg KOH/g. When the difference between acid value and amine value in the first resin RS1 and the second resin RS2 is about 5 mg KOH/g or more and less than about 35 mg KOH/g, the first ink layers INL1-1, INL1-2, and INL1-3 and the second ink layers INL2-1, INL2-2, and INL3 may be mixed without forming separate layers.

In the method for manufacturing a light control member included in a display device according to an embodiment, a first ink that includes a coupling agent, a second ink and a third ink both that do not include a coupling agent are sequentially provided to form each of a plurality of light control units. In an embodiment, the first ink, the second ink, and the third ink are provided as solvent-free inks having high viscosity, the second ink and the third ink may thus not be mixed with the first ink placed thereunder to form a separate layer. In addition, as the inorganic material concentration difference and the difference between acid value and amine value in resins included in the ink are controlled to satisfy the above ranges, the mixing of the first ink and the second ink sequentially provided when the plurality of light control units are formed is further suppressed. Through this, a light control member including a plurality of light control units containing a coupling agent in a lower layer and no coupling agent in an upper layer may be formed, and the first ink and the second ink may be cured at once through a single curing process without the need to separately cure the first ink and the second ink, and thus the process may be simplified and manufacturing costs may be saved.

Figure 8A:
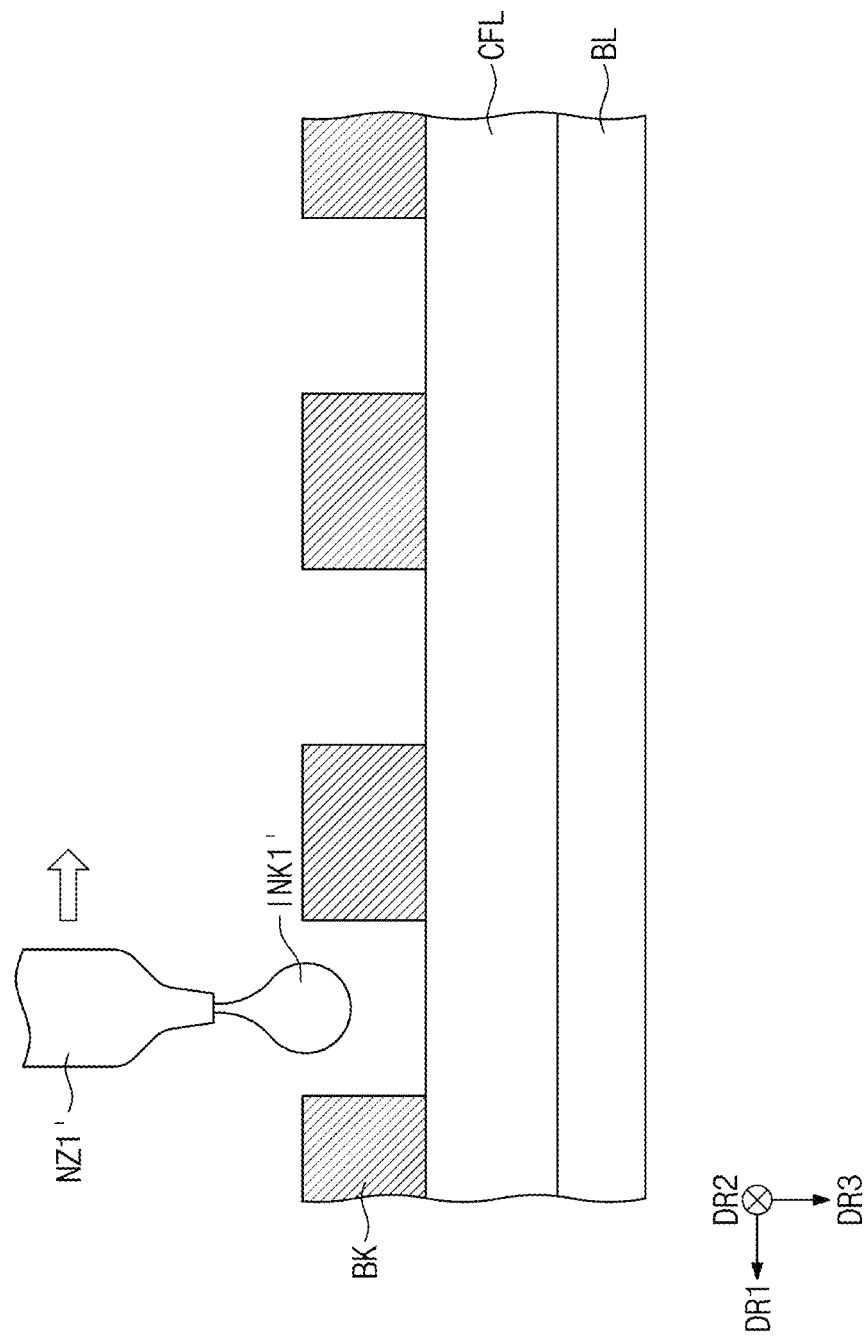
FIGS. 8A and 8B are cross-sectional views showing some processes in a method for manufacturing a display device according to an embodiment of the present invention.
Figure 8B:
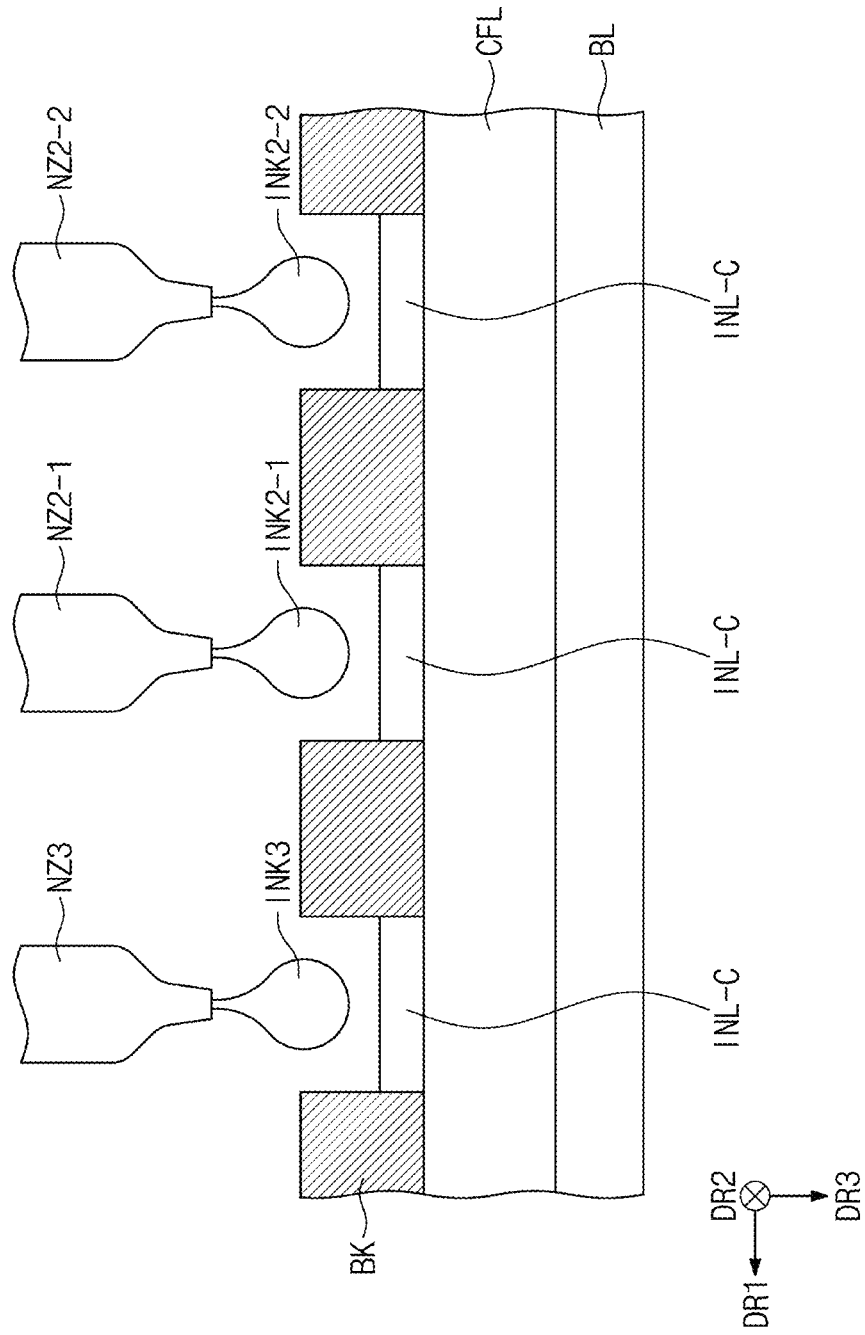
Figure 9:
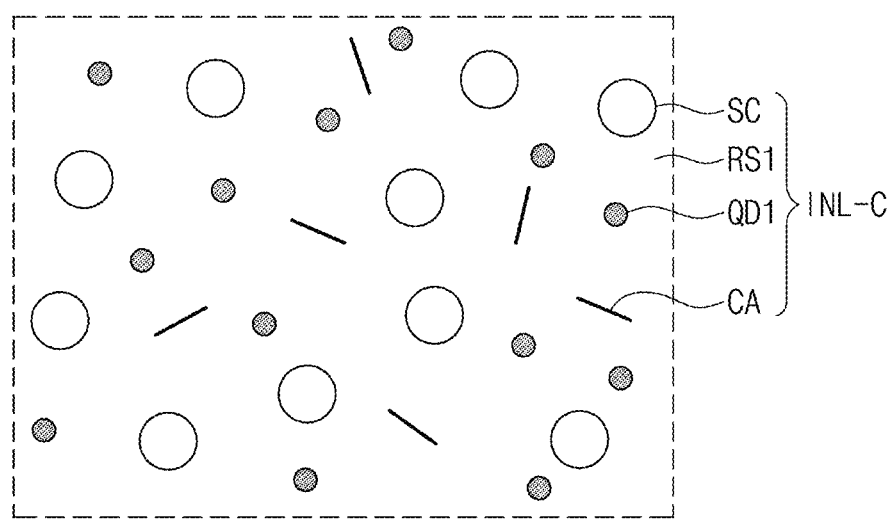
FIG. 9 is a cross-sectional view enlarging some processes in a method for manufacturing a display device according to an embodiment of the present invention.

FIGS. 8A and 8B are cross-sectional views showing some processes in a method for manufacturing a display device according to another embodiment of the present invention. FIG. 9 is a cross-sectional view enlarging some processes in a method for manufacturing a display device according to another embodiment of the present invention. FIGS. 8A and 8B sequentially show processes of providing a first ink to form a first ink layer and providing a second ink to form a second ink layer. FIG. 9 shows an enlarged cross-section of the first ink according to an embodiment.

FIGS. 8A and 8B, the providing of a first ink INK1' to form the first ink layer INL-C may be performed by applying the first ink INK1' between the plurality of barrier ribs BK through a common nozzle NZ1'. That is, the first ink INK1' may be commonly dripped between the plurality of barrier ribs BK to form a common first ink layer INL-C. Thereafter, each of the first sub-ink INK2-1, the second sub-ink INK2-2, and the third ink INL3 may be dripped on the commonly formed first ink layer INL-C and provided.

Referring to FIG. 9, the commonly formed first ink layer INL-C may include a first resin RS1, a coupling agent CA, scattering particles SC, and first light emitting bodies QD1. Unlike what is shown in FIG. 9, the first light emitting bodies QD1 may be omitted in the first ink layer INL-C in another embodiment. Unlike what is shown in FIG. 9, both the scattering particles SC and the first light emitting bodies QD1 may be omitted in the first ink layer INL-C in still another embodiment.

Figure 10A:
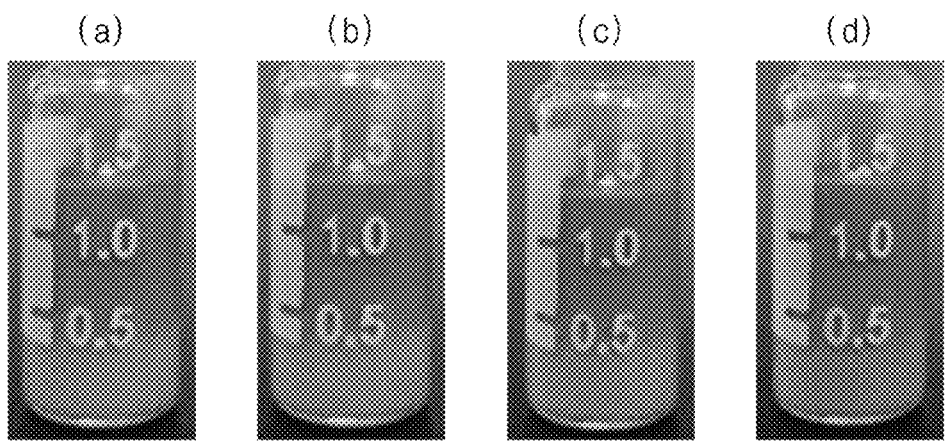
FIG. 10A is a captured image of a separation layer formed through ink according to an embodiment of the present invention.
Figure 10B:
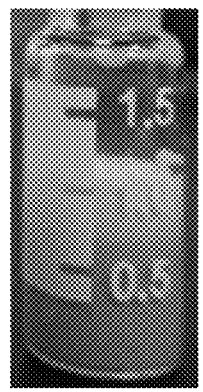
FIG. 10B is a captured image of a separation layer formed through ink according to Comparative Example.

FIG. 10A is a captured image of a separation layer formed through ink according to an embodiment of the present invention. FIG. 10B is a captured image of a separation layer formed through ink according to Comparative Example. FIG. 10A sequentially show a separation layer in which a first ink having an inorganic concentration of 45 wt % and a second ink having an inorganic concentration of 41 wt % are sequentially dripped over time. FIG. 10A shows images taken (a) immediately after dripping the first ink and the second ink, (b) 15 minutes after dripping the first ink and the second ink, (c) 30 minutes after dripping the first ink and the second ink, (d) 30 minutes after dripping the first ink and the second ink and then curing through exposure. FIG. 10B shows an image taken immediately after sequentially dripping the first ink having an inorganic concentration of 41 wt % and the second ink having an inorganic concentration of 6 wt %.

Referring to FIG. 10A, as in an embodiment, when the inorganic concentration difference between the first ink and the second ink is 4 wt % which is in the range of 1 wt % to 20 wt %, even after 30 minutes, mixing of the first ink layer and the second ink layer hardly took place and the layers were separated, and separate layers were formed by exposing the first layer and the second layer at once. However, referring to FIG. 10B, when the first ink and the second ink having an inorganic concentration difference of 35 wt % which is outside the range of the inorganic concentration difference of an embodiment were sequentially dripped, the layers were partially separated, but a portion of the first ink and the second ink was mixed at an interface. Through the results of FIGS. 10A and 10B, it is seen that the solvent-free ink was sequentially dripped to form a first layer and a second layer which are not mixed, and the first layer and the second layer are prevented from being mixed by controlling the difference in the concentration of inorganic materials contained in the ink to form separate layers.

Figure 11:
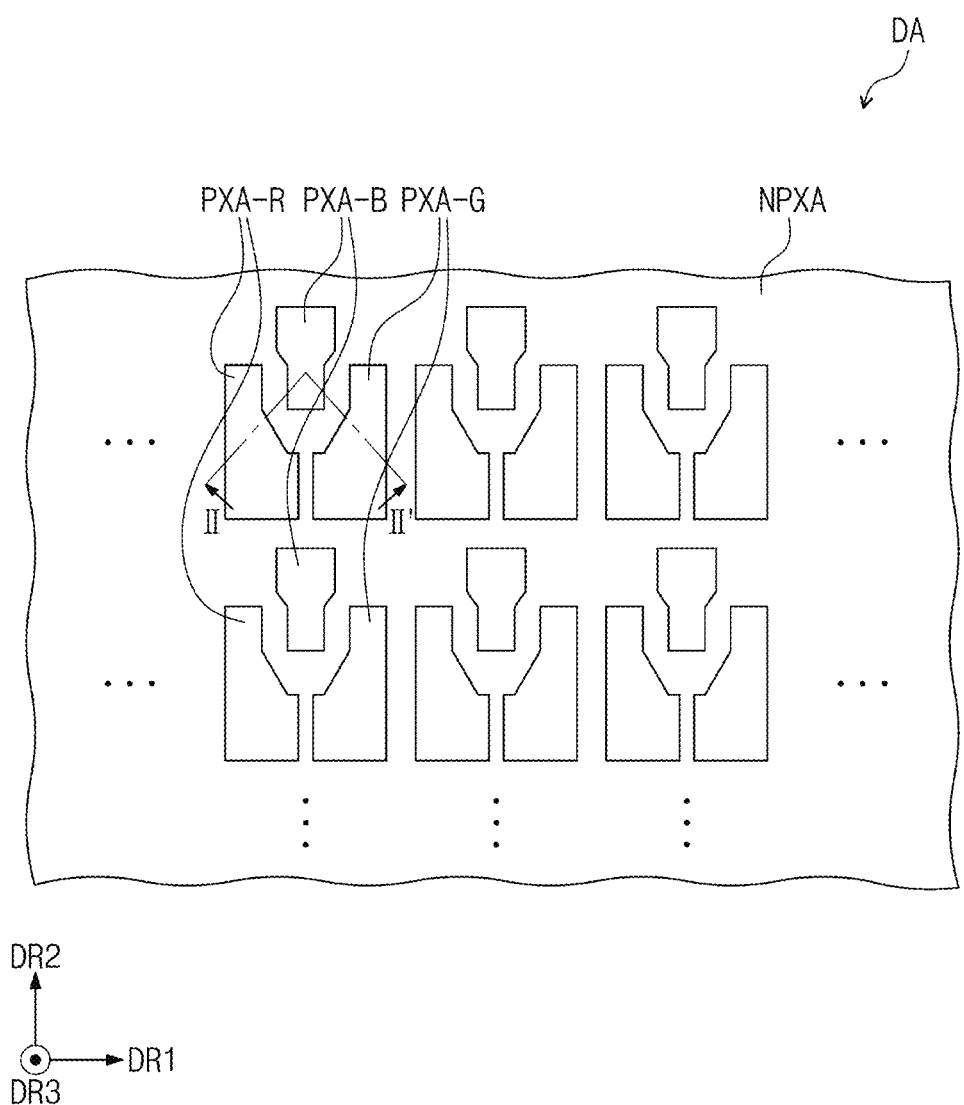
FIG. 11 is a plan view enlarging and showing a portion of a display module included in a display device according to an embodiment of the present invention.

FIG. 11 is a plan view enlarging and showing a portion of a display panel included in a display device according to an embodiment of the present invention. FIGS. 12A and 12B are cross-sectional views enlarging and showing a portion of a display module included in a display device according to an embodiment of the present invention. FIG. 11 shows a portion of a display area DA of a display panel according to an embodiment of the present invention. FIGS. 12A and 12B show portions corresponding to line II-IP of FIG. 11.

Hereinafter, a display module DM of an embodiment described with reference to FIGS. 11, 12A, and 12B is included in the display device ES of an embodiment described with reference to FIG. 1, the display module DM includes a display panel DP and a light control member CCM-a, and the descriptions in FIGS. 3 to 9 may be equally applied to the in the light control member CCM-a.

The display module DM according to an embodiment may include a display panel DP and a light control member CCM-a disposed on the display panel DP, and the light control member CCM-a may include a light control layer CCL and a color filter layer CFL. The light control member CCM-a may include a base layer BL, a light control layer CCL disposed below the base layer BL, and a color filter layer CFL disposed between the light control layer CCL and the base layer BL. In the light control member CCM-a, the light control layer CCL may be disposed adjacent to the display panel DP.

The light control member CCM-a may include a plurality of barrier ribs BK, and light control units CCP-R, CCP-B, and CCP-G disposed between the barrier ribs BK.

Referring to FIGS. 11, 12A, and 12B, the display module DM may include a non-light emitting region NPXA and light emitting regions PXA-R, PXA-G, and PXA-B. Each of the light emitting regions PXA-R, PXA-B, and PXA-G may be a portion emitting light generated from an organic electroluminescence element OEL. An area of each of the light emitting regions PXA-R, PXA-B, and PXA-G may be different in size from one another, and in this case, the area may refer to an area when viewed on a plane (i.e., view in the third direction DR3).

The light emitting regions PXA-R, PXA-B, and PXA-G may be divided into a plurality of groups according to the color of emitted light. In the display module DM of an embodiment shown in FIGS. 11, 12A, and 12B, three light emitting regions PXA-R, PXA-B, and PXA-G for emitting red light, blue light, and green light are presented as an example. For example, the display device ES of an embodiment (FIG. 1) may include a red-light emitting region PXA-R, a blue-light emitting region PXA-B, and a green-light emitting region PXA-G, which are distinct from one another.

In the display module DM according to an embodiment shown in FIGS. 12A and 12B, the display panel DP is shown to include an organic electroluminescence element OEL containing an organic layer OL as a common layer. That is, in the display module DM according to an embodiment shown in FIGS. 12A and 12B, the display panel DP may emit light in the same wavelength range regardless of the light emitting regions PXA-R, PXA-B, and PXA-G of the display module DM. For example, the display panel DP may provide blue light, which is first light, to the light control member CCM-a.

In the display module DM according to an embodiment shown in FIGS. 11, 12A, and 12B, the red-light emitting region PXA-R and the green-light emitting region PXA-G among the light emitting regions PXA-R, PXA-B, and PXA-G may have the same size of area, and the blue-light emitting region PXA-B may have a smaller area than each of the red-light emitting region PXA-R and the green-light emitting region PXA-G. However, the embodiment of the present invention is not limited thereto, and each of the light emitting regions PXA-R, PXA-B, and PXA-G may have the same size of area, or may have different size of area according to the color emitted from the light control units CCP-R, CCP-B, and CCP-G in another embodiment. For example, in the display module DM according to an embodiment, the blue-light emitting region PXA-B may have a largest area, and the green-light emitting region PXA-G may have a smallest area. However, the embodiment is not limited thereto, and the light emitting regions PXA-R, PXA-B, and PXA-G emit light of a color other than red light, blue light, and green light, or the light emitting areas PXA-R, PXA-B, and PXA-G may be provided to have different area ratios.

Each of the light emitting regions PXA-R, PXA-B, and PXA-G may be an area separated by the pixel defining films PDL. The non-light emitting regions NPXA may be regions between neighboring light emitting regions PXA-R, PXA-B, and PXA-G, and may correspond to the pixel defining films PDL.

As shown in FIG. 11, among the light emitting regions PXA-R, PXA-B, and PXA-G, the red-light emitting region PXA-R and the green-light emitting region PXA-G may be symmetrical with respect to a reference axis extending in the second direction DR2 as a center, and the blue-light emitting region PXA-B may be disposed between the red-light emitting region PXA-R and the green-light emitting region PXA-G. When viewed in the first direction DR1, a portion of the blue-light emitting region PXA-B may not overlap the red-light emitting region PXA-R and the green-light emitting region PXA-G. However, the embodiment of the present invention is not limited thereto, and the light emitting regions PXA-R, PXA-B, and PXA-G may have various types of polygons or circles, and an arrangement structure of the light emitting regions is also not limited. For example, in an embodiment, the light emitting regions PXA-R, PXA-B, and PXA-G may have a stripe structure in which the blue-light emitting region PXA-B, the green-light emitting region PXA-G, and the red-light emitting region PXA-R may be alternately arranged, and the arrangement structure of the light emitting regions PXA-R, PXA-B, and PXA-G may be a pantile structure.

Referring to FIGS. 12A and 12B, the display panel DP according to an embodiment includes a base substrate BS, a circuit layer DP-CL disposed on the base substrate BS, and a display element layer DP-OEL disposed on the circuit layer DP-CL. The display element layer DP-OEL may include pixel defining films PDL, an organic electroluminescence element OEL disposed between the pixel defining films PDL, and a thin film encapsulation layer TFE disposed on the organic electroluminescence element OEL.

The pixel defining films PDL may be formed of a polymer resin. For example, the pixel defining films PDL may be formed including a polyacrylate-based resin or a polyimide-based resin. In addition, the pixel defining films PDL may be formed by further including an inorganic material in addition to the polymer resin. The pixel defining films PDL may be formed including a light absorbing material, or may be formed including a black pigment or a black dye. In addition, the pixel defining films PDL may be formed of an inorganic material. For example, the pixel defining films PDL may be formed including silicon nitride (SiNx), silicon oxide (SiOx), silicon oxide (SiOxNy), etc. The pixel defining films PDL may define the light emitting regions PXA-R, PXA-B, and PXA-G. The light emitting regions PXA-R, PXA-B, and PXA-G, and a non-light emitting region NPXA may be separated by the pixel defining films PDL.

The pixel defining films PDL may overlap the barrier ribs BK. That is, each of the plurality of pixel defining films PDL may overlap corresponding to each of the plurality of barrier ribs BK.

The organic electroluminescence element OEL may include a first electrode EL1 and a second electrode EL2 facing each other, and an organic layer OL disposed between the first electrode EL1 and the second electrode EL2. The organic layer OL may include a hole transport region, an emission layer, and an electron transport region. The hole transport region may include a hole injection layer adjacent to the first electrode EL1 and a hole transport layer disposed between the hole injection layer and the emission layer, and the electron transport region may include an electron injection layer adjacent to the second electrode EL2 and an electron transport layer disposed between the emission layer and the electron injection layer.

The thin film encapsulation layer TFE may be disposed on the organic electroluminescence element OEL, and the thin film encapsulation layer TFE may be disposed on the second electrode EL2. The thin film encapsulation layer TFE may be directly disposed on the second electrode EL2. The thin film encapsulation layer TFE may be a single layer or a laminated layer of a plurality of layers.

A display device according to an embodiment includes a light control member disposed on a display panel. Each of a plurality of light control units included in the light control member includes a first layer and a second layer, the first layer includes a coupling agent, and the second layer does not include a coupling agent, and thus coating properties and patterning quality of the light control unit are improved while light emitting efficiency of light emitting bodies included in the light control unit is not deteriorated. Accordingly, the display device may have improved display quality and reliability.

Referring to FIG. 12B, a display module DM-1 according to an embodiment may include a display panel DP and a light control member CCM-al disposed on the display panel DP, and the light control member CCM-al may include a light control layer CCL-1 and a color filter layer CFL-1. In the display module DM-1 according to an embodiment, the light control layer CCL-1 may be disposed on the display panel DP. The light control layer CCL-1 may be disposed on the display panel DP with the first capping layer CPL1 therebetween.

The light control layer CCL-1 of the light control member CCM-al may include a plurality of barrier ribs BK and light control units CCP-R, CCP-B, and CCP-G disposed between the barrier ribs BK. The light control units CCP-R, CCP-B, and CCP-G may be formed by sequentially providing the first inks INK1-1, INK1-2, and INK1-3 (see FIG. 6A) on the first capping layer CPL1, and then the second inks INK2-1 and INK2-2 (see FIG. 6B) and the third ink INK3 (see FIG. 6B). That is, the light control units CCP-R, CCP-B, and CCP-G may be formed on the display panel DP through a sequential process. A second capping layer CPL2 may be disposed on the plurality of barrier ribs BK and the light control units CCP-R, CCP-B, and CCP-G disposed between the barrier ribs BK to prevent the light control units CCP-R, CCP-B, and CCP-G from being exposed to moisture/oxygen.

A color filter layer CFL-1 may be disposed on the light control layer CCL-1. The color filter layer CFL-1 may include a low refractive layer LRL-1. The color filter layer CFL-1 may include a light blocking unit BM-1 and filters CF-R1, CF-B1, and CF-G1. However, the embodiment is not limited thereto, and portions of the low refractive layer LRL-1, the light blocking unit BM-1, and the filters CF-R1, CF-B1, and CF-G1 included in the color filter layer CFL-1 may be omitted in another embodiment. The color filter layer CFL-1 may be formed on the light control layer CCL-1 through a sequential process. That is, in the display module DM according to an embodiment, the light control layer CCL-1 and the color filter layer CFL-1 may be sequentially formed on the display panel DP through a sequential process.

Figure 13:
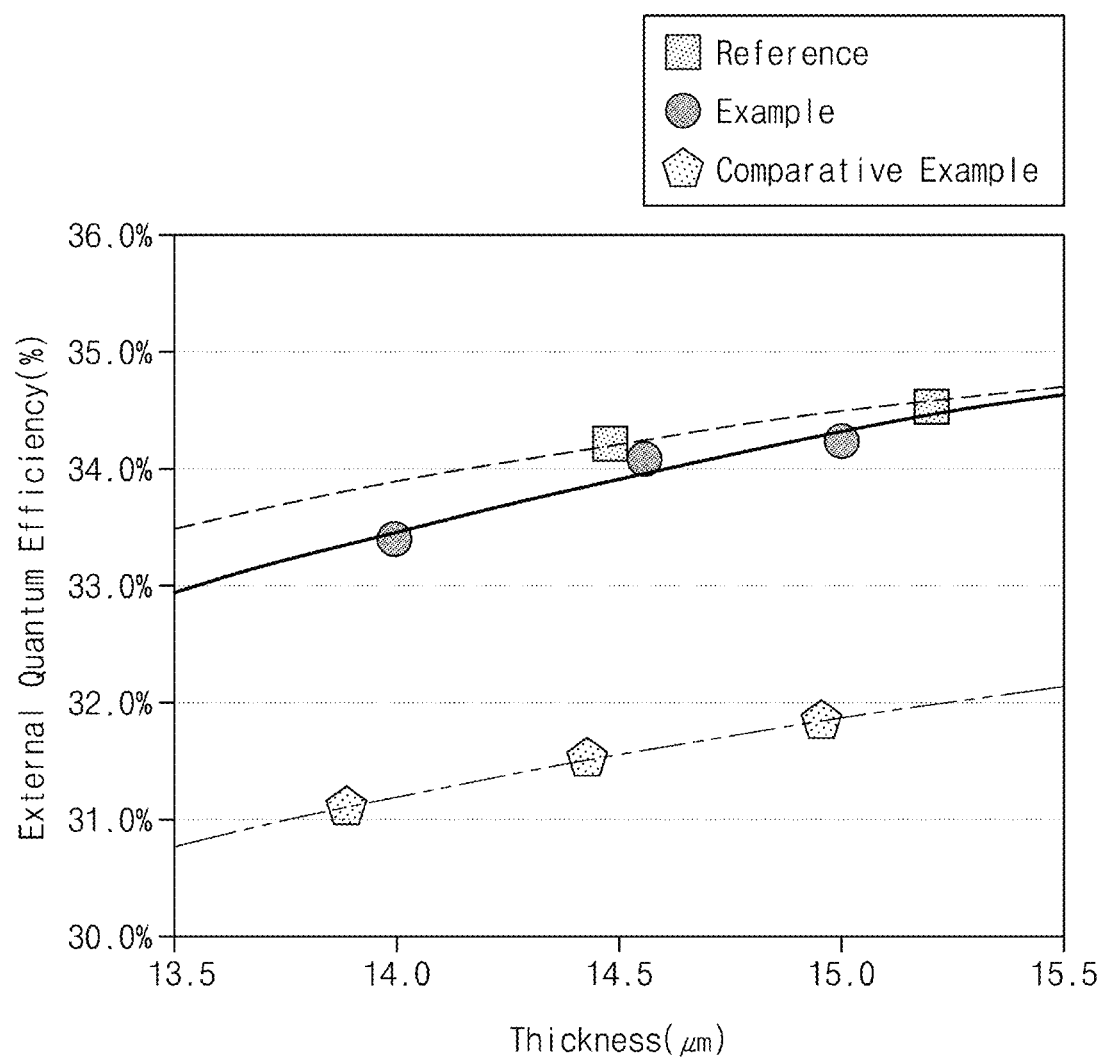
FIG. 13 is a graph showing external quantum efficiency according to thickness of a light control unit pattern according to an embodiment of the present invention and a light control unit pattern according to Comparative Example.

FIG. 13 is a graph showing external quantum efficiency according to thickness of a light control unit pattern according to an embodiment of the present invention and a light control unit pattern according to Comparative Example.

In FIG. 13, Example is a graph of external quantum efficiency according to thickness (unit: micrometers ($\mu$m)) of a light control unit formed by sequentially applying a first ink including a coupling agent and a second ink not including a coupling agent, and then curing the first ink and the second ink together. Comparative Example is a graph of external quantum efficiency according to thickness of a light control unit formed by applying and curing single ink containing a coupling agent. Reference Example is a graph of external quantum efficiency according to thickness of a light control unit formed by applying and curing single ink not containing a coupling agent.

Referring to FIG. 13, it is seen that the light control unit pattern of an embodiment does not have deterioration in the external quantum efficiency of the light emitting bodies due to the coupling agent, unlike Comparative Example formed of the single ink containing a coupling agent, and thus exhibits external quantum efficiency similar to that of Reference Example throughout the thickness range. That is, it is seen that the light control unit pattern according to an embodiment of the present invention includes a first layer containing a coupling agent to secure bonding force with a base layer, and further includes a second layer not containing a coupling agent to prevent deterioration in external quantum efficiency of light emitting bodies and secure excellent light emitting efficiency of a display device when applied to the display device.

Although the present invention has been described with reference to a preferred embodiment of the present invention, it will be understood that the present invention should not be limited to these preferred embodiments but various changes and modifications can be made by those skilled in the art without departing from the spirit and scope of the present invention. Accordingly, the technical scope of the present invention is not intended to be limited to the contents set forth in the detailed description of the specification, but is intended to be defined by the appended claims.

INDUSTRIAL APPLICABILITY

In light control units applied to a display device, at least some of the light control units include a coupling agent to improve pattern forming quality of the light control units. However, the coupling agent may deteriorate light efficiency of the light control units, and decreases storage characteristics of ink forming the light control units. Therefore, the present invention in which the coupling agent included in a lower layer of the light control unit increases bonding force between the light control unit and a base layer to improve reliability with no deterioration in light emitting efficiency of light emitting bodies included in an upper layer of the light control unit and no deterioration in storage characteristics of ink forming the light control unit has high industrial applicability.

The invention claimed is:

1. A display device comprising:
a display panel; and
a light control member disposed on the display panel,
wherein the light control member includes:
    a plurality of barrier ribs spaced apart from each other; and
    a plurality of light control units disposed between the plurality of barrier ribs, respectively,
wherein at least one of the plurality of light control units includes:
    a first layer including a first base resin, and a coupling agent dispersed in the first base resin; and
    a second layer disposed on the first layer, and including a second base resin and light emitting bodies dispersed in the second base resin.

2. The display device of claim 1, wherein the second layer further includes scattering particles dispersed in the second base resin.

3. The display device of claim 1, wherein the first layer further includes scattering particles dispersed in the first base resin.

4. The display device of claim 1, wherein the first layer has a first inorganic material concentration, and the second layer has a second inorganic material concentration different from the first inorganic material concentration.

5. The display device of claim 4, wherein a difference between the first inorganic material concentration and the second inorganic material concentration is about 1 percentage by weight (wt %) to about 20 wt %.

6. The display device of claim 1, wherein the second layer does not contain the coupling agent.

7. The display device of claim 1, wherein a difference between acid values and amine values in each of the first base resin and the second base resin is less than about 5 milligrams of potassium hydroxide per gram (mg KOH/g).

8. The display device of claim 1, wherein a difference between acid values and amine values in each of the first base resin and the second base resin is about 35 mg KOH/g or more.

9. The display device of claim 1, wherein the display panel comprises a light emitting device, which generates first light, and
the plurality of light control units comprises a first light control unit, which transmits the first light, a second light control unit, which converts the first light into second light, and a third light control unit, which converts the first light into third light.

10. The display device of claim 9, wherein:
the first light control unit comprises a first control layer including the coupling agent, and a second control layer disposed on the first control layer;
the second light control unit comprises a third control layer including the coupling agent, and a fourth control layer disposed on the third control layer and including first light emitting bodies, which convert the first light into the second light;
the third light control unit comprises a fifth control layer including the coupling agent, and a sixth control layer disposed on the fifth control layer and including second light emitting bodies, which convert the first light into the third light, and
the light emitting bodies include the first light emitting bodies and the second light emitting bodies.

11. The display device of claim 10, wherein each of the first control layer, the third control layer, and the fifth control layer further comprises the first light emitting bodies.

12. The display device of claim 10, wherein the third control layer further comprises the first light emitting bodies, and the fifth control layer further comprise the second light emitting bodies.

13. A display device comprising:
a display panel, which generates first light; and
a light control member disposed on the display panel,
wherein the light control member includes:
    a first light control unit, which transmits the first light, a second light control unit, which converts the first light into second light, and a third light control unit, which converts the first light into third light,
wherein at least one of the first light control unit, the second light control unit, and the third light control unit includes:
    a first layer including a first base resin, a coupling agent dispersed in the first base resin, and scattering particles dispersed in the first base resin; and
    a second layer disposed on the first layer, and including a second base resin and light emitting bodies dispersed in the second base resin.

14. A method for manufacturing a display device, the method comprising:
preparing a display panel; and
forming a light control member on the display panel,
wherein the forming of the light control member includes:
    providing a first ink including a coupling agent to form a first ink layer;
    providing a second ink including light emitting bodies on the first ink layer to form a second ink layer; and
    curing the first ink layer and the second ink layer.

15. The method of claim 14, wherein: the first ink comprises a first resin, scattering particles dispersed in the first resin, and the coupling agent dispersed in the first resin;
the second ink comprise a second resin, scattering particles dispersed in the second resin, and the light emitting bodies dispersed in the second resin; and
the first ink has a first inorganic material concentration, and the second ink has a second inorganic material concentration different from the first inorganic material concentration.

16. The method of claim 15, wherein a difference between the first inorganic material concentration and the second inorganic material concentration is about 1 wt % to about 10 wt %.

17. The method of claim 15, wherein a difference between acid values and amine values in each of the first resin and the second resin is less than about 5 mg KOH/g or about 35 mg KOH/g or more.

18. The method of claim 14, wherein the forming of the light control member further includes forming a plurality of barrier ribs before the providing of the first ink, and the first ink and the second ink are provided in at least one of regions defined between the plurality of barrier ribs.

19. The method of claim 18, wherein the providing of the first ink comprises providing, the regions between the plurality of barrier ribs, with a first pattern ink including scattering particles, a second pattern ink including first light emitting bodies, and a third pattern ink including second light emitting bodies different from the first light emitting bodies, respectively.

20. The method of claim 18, wherein:

the providing of the first ink comprises providing the first ink commonly to the regions between the plurality of barrier ribs; and the providing of the second ink comprises providing a first sub-ink including the first light emitting bodies, and a second sub-ink including the second light emitting bodies different from the first light emitting bodies, on the first ink layer.

* * * * *